United States Patent [19]

Judge

[11] Patent Number: 5,098,187
[45] Date of Patent: Mar. 24, 1992

[54] APPARATUS AND METHOD FOR SIGNAL GENERATION AND FOR PROCESSING

[75] Inventor: John F. X. Judge, Yorktown Heights, N.Y.

[73] Assignee: Alfa-Laval AB, Stockholm, Sweden

[21] Appl. No.: 616,190

[22] Filed: Dec. 14, 1990

Related U.S. Application Data

[62] Division of Ser. No. 471,357, Mar. 2, 1983, Pat. No. 4,991,106.

[51] Int. Cl.⁵ .............................................. G01J 3/42
[52] U.S. Cl. .................................. 356/325; 356/236; 250/228
[58] Field of Search ............... 356/319, 323, 324, 325, 356/236; 250/228

[56] References Cited

U.S. PATENT DOCUMENTS

| | | | |
|---|---|---|---|
| 2,474,098 | 6/1949 | Dimmick | 356/325 |
| 3,207,996 | 9/1965 | Sundstrom | 356/325 |
| 3,560,098 | 2/1971 | Witte et al. | 356/323 |
| 4,305,663 | 12/1981 | Perkins et al. | 356/325 |

Primary Examiner—F. L. Evans
Attorney, Agent, or Firm—Davis Hoxie Faithfull & Hapgood

[57] ABSTRACT

The apparatus and method of the invention are applied to the generation of alternating sample, dark, reference and dark beams for direction of said sample and reference beams into an integrating sphere which comprises detecting means and a reference source, for spectroscopic analysis of a sample contained in a sample cell which is operatively associated with said integrating sphere; to the generation of digital control signals attendant the generation of said beams; and to the processing of the multiplexed, sample analysis results analog data signal, as provided by the detecting means, by aligning a digital control signal therewith in time and further operating upon the thusly aligned data signal to precisely calculate the sample analysis results therefrom.

9 Claims, 18 Drawing Sheets

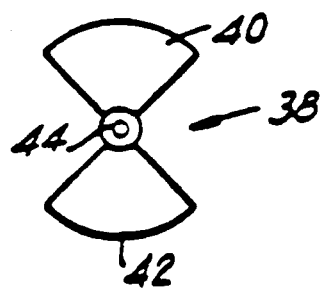
FIG.2A
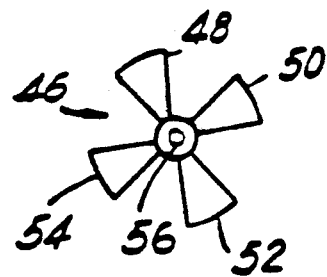
FIG.2B
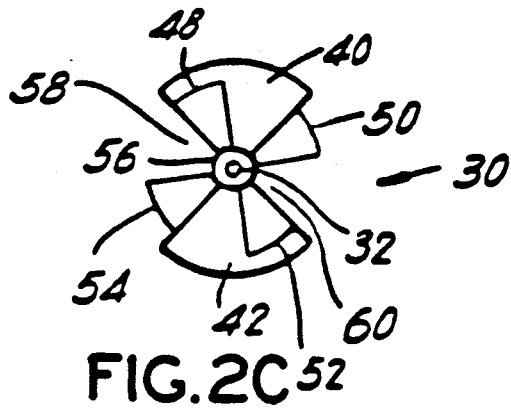
FIG.2C
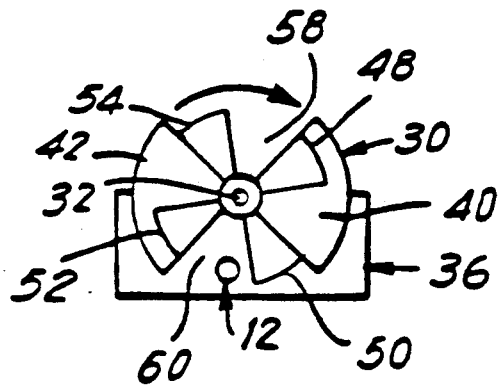
FIG.3
| FOR EACH ½ ROTATION OF 30 | | | |
|---|---|---|---|
| 0°    45°    90°    135°    180° | | | |
| REF. | DARK | SAMPLE | DARK |
FIG.4

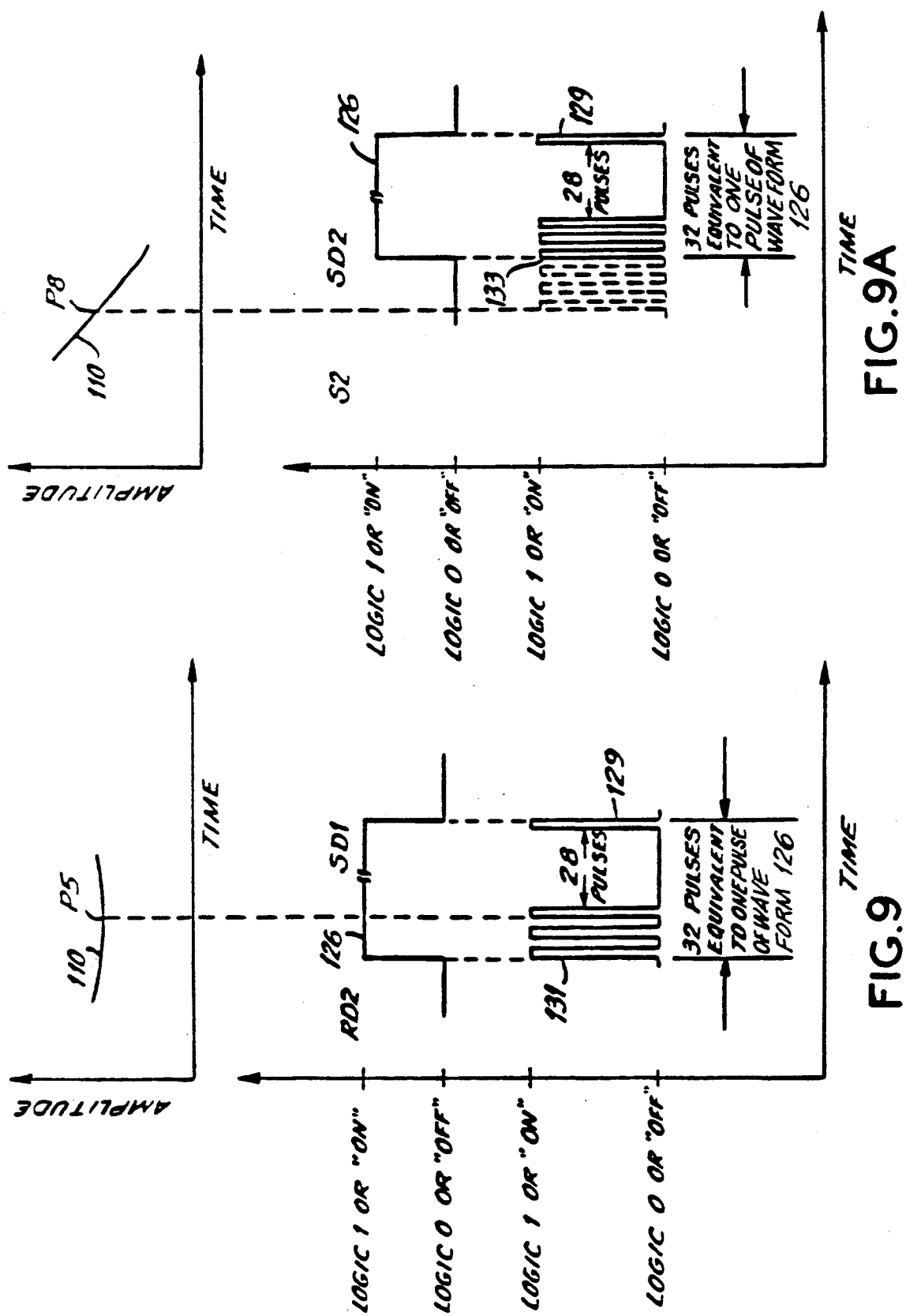

ered or operable as disclosed herein, or to provide the particularly high degrees of signal alignment precision and stability as are provided by the apparatus and method of this invention.

APPARATUS AND METHOD FOR SIGNAL GENERATION AND FOR PROCESSING

This is a divisional of copending application Ser. No. 06/471,357, filed on Mar. 2, 1983, now U.S. Pat. No. 4,991,106.

BACKGROUND OF THE INVENTION

1. Field of the Invention

This invention relates to new and improved apparatus and method for signal generation and for signal processing which are particularly adapted for use attendant optical/electronic sample analysis.

2. Description of the Prior Art

Although a wide variety of apparatus and methods for signal generation and signal processing are, of course, known in the prior art, none are known to be configured and operable in the manner of those of this invention, particularly as applied to optical/electronic sample analysis.

More specifically, and regarding signal generation, although the combined fixed sample beam mirror and rotating optical chopper assembly disclosed by Technicon Instruments Corporation of Tarrytown, N.Y., at the Pittsburgh Conference of Analytical Instrumentation in March, 1981, does function to generate sample and reference beams for direction into an integrating sphere attendant spectroscopic quantitative sample analysis, that assembly does not include alternating sample, reference and dark segments; whereby the electronic signals generated attendant the detection of those sample and reference beams per se do not constitute a single composite or multiplexed analog data signal containing, in precisely timed sequence, all sample, reference and dark data required for calculation of the sample analysis results.

Regarding signal processing, it may be understood that the Technicon Instruments Corporation disclosure here under discussion contemplated the use of a conventional analog phone lock loop driven off of the analog data signal to produce the requisite reference or control signal. This technique is disclosed in detail, for example, in *Electronics and Instrumentation For Scientists* by H. V. Malmstadt, et al., as published in 1981 by The Benjamin Cummings Publishing Company, Inc. of Menlo Park, Calif.; and is known to give rise to problems of reference vis-a-vis data signal time lag, and variation in reference signal level in accordance with variation in data signal level. Alternatively, although the use of commonly driven encoder devices to generate the requisite reference or control signals attendant the operation of rotatable optical beam generation devices or the like is also well known in the prior art, in many instances simple mechanical alignment between the encoder and beam generation devices is relied upon for the requisite data-control signal alignment in time. This mechanical alignment technique is simply not sufficiently precise for the purposes under discussion. Too, although non-mechanical apparatus and methods of optical beam generated-encoder generated signals alignment have been proposed, none are known to be configured or operable as disclosed herein, or to provide the particularly high degrees of signal alignment precision and stability as are provided by the apparatus and method of this invention.

OBJECTS OF THE INVENTION

It is, accordingly, an object of this invention to provide new and improved apparatus and method for signal generation which are particularly adapted for use attendant spectroscopic sample analysis.

Another object of this invention is the provision of apparatus and method as above which are operable to generate precisely defined alternating sample, dark, reference and dark optical beams for spectroscopic sample analysis.

Another object of this invention is the provision of apparatus and method as above which are further operable to generate precisely defined electronic digital control signals attendant the generation of said optical beams.

Another object of this invention is the provision of apparatus and method as above which are operable to generate said beams through use of a single light source.

Another object of this invention is the provision of apparatus and method as above which are of basically simple mechanical design and construction, and which require the use of only readily available components of proven dependability to provide for long periods of satisfactory, maintenance-free operation.

Another object of this invention is the provision of apparatus and method as above which are inherently versatile, and which may be readily modified to modify said optical beams and/or said electronic control signals.

Another object of this invention is the provision of apparatus and method as above wherein the electronic control signals generated attendant the generation of said optical beams are operable upon to effect the particularly precise and stable processing of the electronic sample analysis results signals thereby maximizing the accuracy of the sample analysis results.

Another object of this invention is the provision of new and improved apparatus and method for signal processing which are particularly adapted to the processing of the electronic sample analysis results signals from spectroscopic sample analysis means.

Another object of this invention is the provision of signal processing apparatus and method as above which are operable in particularly precise and stable manner.

Another object of this invention is the provision of signal processing apparatus and method as above which are operable to electronically align in time digital control and sample analysis results for processing of the latter, thereby rendering unnecessary precise and elaborate pre-alignment of said signals.

Another object of this invention is the provision of signal processing apparatus and method as above which are tolerant of reasonable variations in time of said digital control signal.

Another object of this invention is the provision of signal processing apparatus and method as above which are operable upon a multiplexed, sample analysis results analog data signal to demodulate and demultiplex the same, and to separately identify and calculate as such the respective sample analysis results information segments contained therein for calculation of the sample analysis results therefrom.

Another object of this invention is the provision of signal processing apparatus and method as above which are of relatively simple configuration, and which require the use of only readily available components of proven dependability and stability to provide for long periods of satisfactory, maintenance-free operation.

A further object of this invention is the provision of signal generation apparatus and method as above, and signal processing apparatus and method as above which are particularly adapted for joint use attendant spectroscopic sample analysis to provide sample analysis results of the highest degrees of accuracy and reproducibility.

SUMMARY OF THE INVENTION

As disclosed herein the apparatus and method of this invention are applied to the repeated recovery of highly precise information from an amplitude modulated, multiplexed optically generated analog data signal which is outputted by spectroscopic quantitative sample analysis means in proportion to the reflected light energy levels detected thereby. This analog signal comprises different information-bearing segments arranged serially in time and changing at determinable transition points. The apparatus and method of the invention operate to precisely generate alternating sample, dark, reference and dark beams which result in said detected energy levels attendant spectroscopic sample analysis; and operate to generate digital control signals attendant the generation of said beams. The apparatus and method of the invention operate upon said analog data signal, and one of said digital control signals, to align the latter in time with said analog data signal transition points thus enabling the information in each of said data signal segments to be separately identified and calculated as such for calculation of the sample analysis results therefrom. This operation upon these signals includes the demodulation of the multiplexed data signal, the demultiplexing of the thusly demodulated data signal, the separate identification and calculation as such of the information from the thusly demultiplexed data signal in accordance with the particular data signal segment which provided the same, the verification of signal alignment, the change in that alignment if required, the synchronization of the demodulation, demultiplexing and alignment verification, and the calculation of the sample analysis results from the thusly identified, calculated and alignment-verified data signal segments information.

BRIEF DESCRIPTION OF THE DRAWINGS

The above and other objects and advantages of this invention are believed made clear by the following detailed description thereof taken in conjunction with the accompanying drawings wherein:

FIGS. 2A, 2B, and 2C are front views illustrating the configuration and assembly of the sample beam mirror of the apparatus of FIG. 1;

FIG. 3 is a front elevational view depicting the light source, and sample and reference beam mirrors of the apparatus of FIG. 1 in aligned, operable relationship;

FIG. 4 is a chart explaining the operation of the light source and mirrors combination of FIG. 3;

FIGS. 7 and 8 are graphs of digital control signals as generated by the apparatus of FIG. 1;

FIGS. 9 and 9A are graphs depicting two representative data and control signal misalignment conditions for correction by the apparatus and method of this invention;

DETAILED DESCRIPTION OF THE INVENTION

Figure 1:
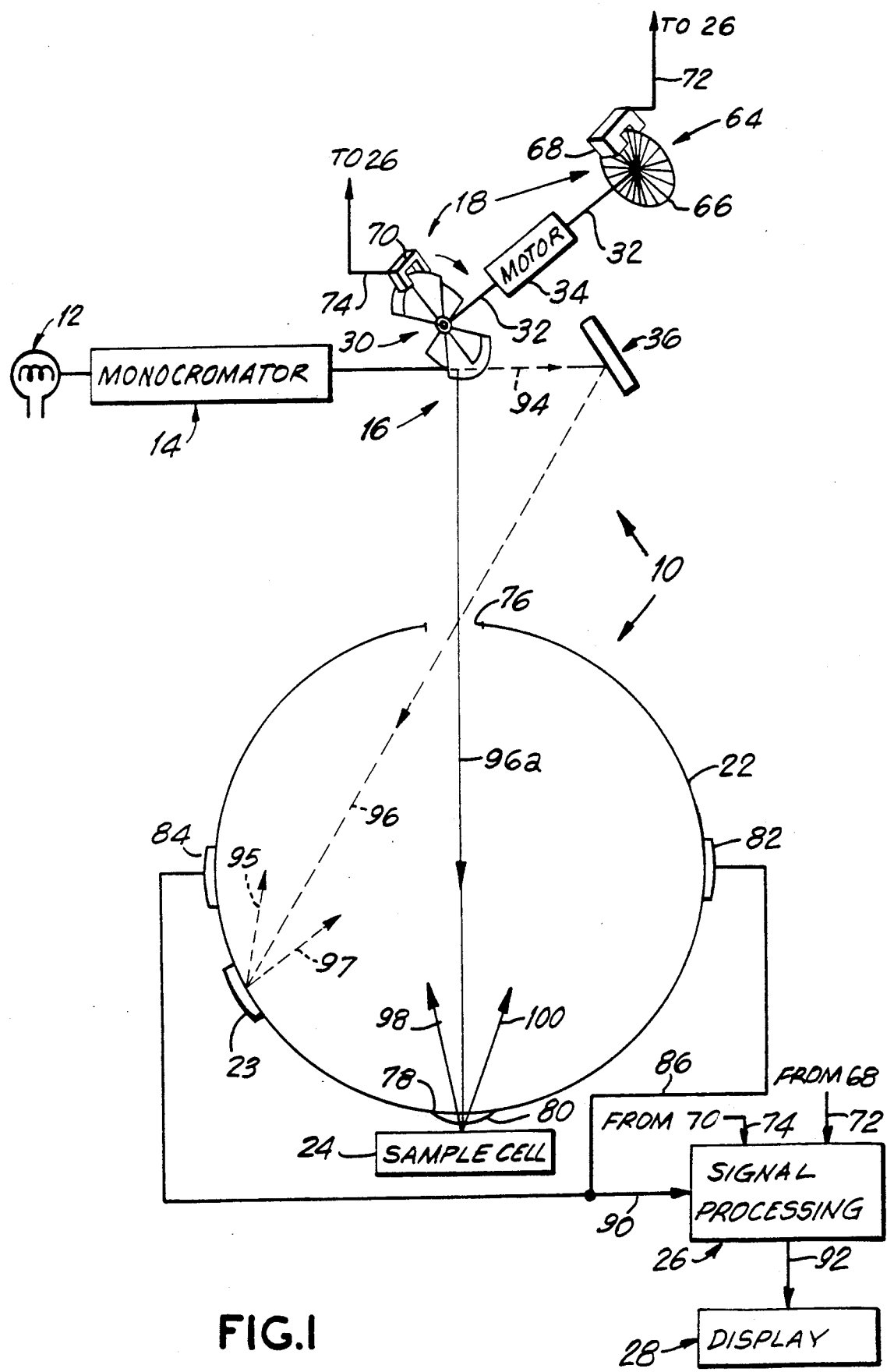
FIG. 1 is a generally schematic diagram of a representative spectroscopic quantitative sample analysis system configured and operable in accordance with the teachings of the apparatus and method of this invention.

Referring now to FIG. 1, a spectroscopic quantitative sample analysis system configured and operable in accordance with the teachings of this invention is indicated generally at 10; and comprises a single 1R source 12, a monochromator 14, sample and reference beam generation means 16, timing and control signal generation means 18, light integrating sphere 22, reference source 23, sample cell 24, signal processing means 26, and analysis results display means 28, respectively. A representative spectroscopic quantitative sample analysis system of this general nature, without the improvements of this invention, is disclosed in U.S. Pat. No. 4,278,887, the disclosure of which is incorporated by reference herein.

The sample and reference beam generation means 16 comprise an optical chopper taking the form of a sample beam mirror 30 which is supported by, for rotation with, shaft 32 of drive motor 34, and a fixed reference beam mirror 36, both of which are disposed as shown in optical alignment with monochromator 14.

As seen in FIGS. 2A and 2B, the sample beam mirror 30 comprises a "bow tie" section 38 which includes arcuately spaced, 90° mirror section 40 and 42 supported as shown from hub 44; and a "double bow tie" section 46 which includes arcuately spaced, 45° light absorbing sections 48, 50, 52 and 54 supported as shown from hub 56. Coaxial mounting as shown in FIG. 2C of sections 38 and 46 on motor shaft 32 results in the formation of the sample beam mirror 30, including arcuate, 45° blank spaces 58 and 60. Since, as made clear by FIG. 2C, mirrored arcuate section 40 and 42 are of greater radius than light absorbing sections 48, 50, 52 and 54, the periphery of sample beam mirror 30 will be constituted by the edges of mirrored sections 40 and 42, only, as interrupted by the empty spaces 58 and 60.

The timing and control signal generation means 18 of FIG. 1 comprise an encoder 64 which is also supported and rotated as shown by shaft 32 of drive motor 34 in unison with sample beam mirror 30. The encoder 64 is an angular position indicator which operates to generate an electronic signal at multiple angular positions of rotating motor shaft 32, and thus of sample beam mirror 30; and, to this effect, may for example take the form of a lined disc 66 which is operably associated as shown with an appropriate PE sensing device 68 for the generation of a pulse attendant the passage of each of the disc lines through the sensing device. Further included in timing and control signal generation means 18 is a reference/sample beam sensor 70 which may, for example, take the form of an appropriate PE sensing device operatively associated as shown with the periphery of sample beam mirror 30 for generation of a pulse attendant the passage of each of the mirror spaces 58 and 60 through the sensing device. The respective pulse outputs of the encoder 64 and reference/sample beam sensor 70 are applied as indicated on lines 72 and 74 to signal processing means 26.

The integrating sphere 22 comprises light entry and exit ports 76 and 78, with the latter including lens means 80 arcuate, 45° blank spaces 58 and 60. Since, as made clear by FIG. 2C, mirrored arcuate sections 40 and 42 are of greater radius than light absorbing sections 48, 50, 52 and 54, the periphery of sample beam mirror 30 will be constituted by the edges of mirrored sections 40 and 42, only, as interrupted by the empty spaces 58 and 60.

The timing and control signal generation means 18 of FIG. 1 comprise an encoder 64 which is also supported and rotated as shown by shaft 32 of drive motor 34 in unison with sample beam mirror 30. The encoder 64 is an angular position indicator which operates to generate an electronic signal at multiple angular positions of rotating motor shaft 32, and thus of sample beam mirror 30; and, to this effect, may for example take the form of a lined disc 66 which is operably associated as shown with an appropriate PE sensing device 68 for the generation of a pulse attendant the passage of each of the disc lines through the sensing device. Further included in timing and control signal generation means 18 is a reference/sample beam sensor 70 which may, for example, take the form of an appropriate PE sensing device operatively associated as shown with the periphery of sample beam mirror 30 for generation of a pulse attendant the passage of each of the mirror spaces 58 and 60 through the sensing device. The respective pulse outputs of the encoder 64 and reference/sample beam sensor 70 are applied as indicated on lines 72 and 74 to signal processing means 26.

The integrating sphere 22 comprises light entry and exit ports 76 and 78, with the latter including lens means 80 which focus specularly reflected, non sample information-bearing light back out of sphere 22 to prevent the collection thereof in the same. Further included in the integrating sphere 22 are detectors 82 and 84 which are electrically connected as indicated by lines 86, 88 and 90 to the signal processing means 26 for application of the analog detector output currents thereto. The sample analysis results display means 28 are electrically connected as indicated by line 92 to the signal processing means 26 for application of appropriately converted, phase locked and processed digital voltage levels from the signal processing means to the display means for display and/or recording in the form of the sample analysis results.

With sample beam mirror 30 and reference beam mirror 36 configured as described and disposed as shown relative to light source 12, the provision of three distinct light beam states, namely sample, reference and dark, relative to integrating sphere 22 becomes possible. More specifically, and referring now to FIG. 3 wherein the light source 12, sample beam mirror 30 and reference beam mirror 36 are depicted in aligned relationship, with monochromator 14 eliminated for clarity of illustration, it may be seen each half revolution of sample beam mirror 30 will provide for the generation of: (a) a reference light beam as indicated in dashed lines by rays 94 and 96 in FIG. 1 when the monochromatized light from source 12 passes through sample beam mirror arcuate space 60 and is reflected from reference beam mirror 36 for impingement upon reference source 23 in the integrating sphere for reflection from the former as indicated by rays 95 and 97 for collection and ultimate impingement upon integrating sphere detectors 82 and 84 to thus provide a reference current signal to the signal processing means 26 on lines 86, 88 and 90, respectively; (b) no light beam when the monochromatized light from source 12 impinges upon and is totally absorbed by the succeeding light absorbing section 50 of the sample beam mirror 30 to thus result in a dark current at the signal processing means 26; (c) a sample light beam as indicated by ray 96a in FIG. 1 as the monochromatized light from source 12 is reflected from the succeeding mirror section 40 of sample beam mirror 30 for impingement normal to the sample cell 24 in the integrating sphere and diffuse reflectance therefrom as indicated by rays 98 and 100 for collection within the integrating sphere 22 and ultimate impingement upon sphere detectors 82 and 84 to thus provide a sample current signal to the signal processing means 26 on lines 86, 88 and 90, respectively; and (d) no light beam as the monochromatized light from source 12 impinges upon and is totally absorbed by the succeeding light absorbing section 48 with attendant dark current signal at the signal processing means 26. This sequence is repeated as described for each succeeding half revolution of the sample beam mirror 30; with the chart of FIG. 4 making clear that each sample signal current, and each reference signal current, are respectively flanked by two dark signal currents at the signal processing means 26.

Figure 5:
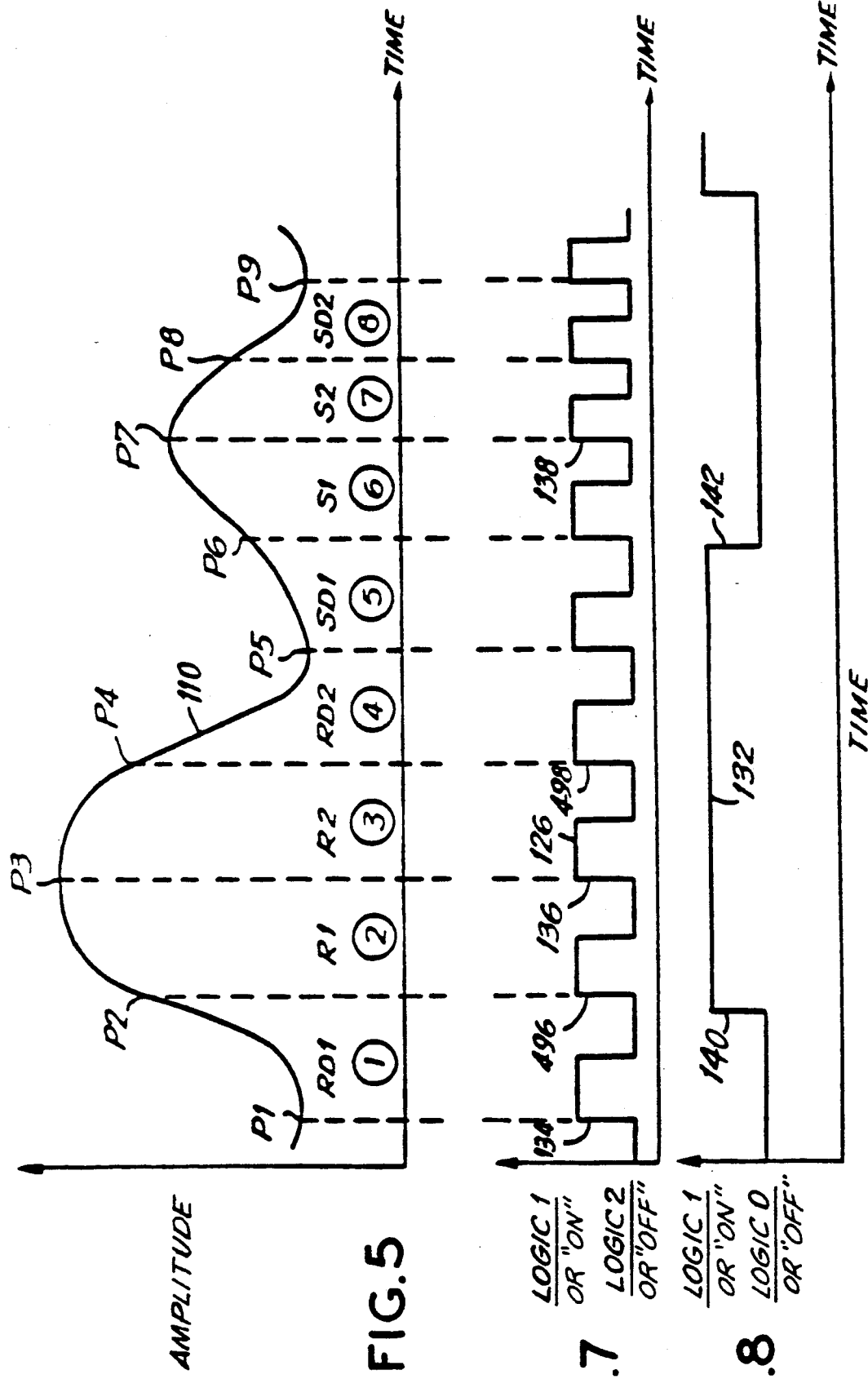
FIG. 5 is a graph depicting a representative composite, analog sample analysis data signal as outputted by the integrating sphere detectors of FIG. 1.

Operation as described of the sample and reference beam mirrors 30 and 36 results in the generation of an amplitude modulated, composite reflectance, i.e. (sample-sample dark)/(reference-reference dark), signal, as representatively indicated by the appropriately biased AC wave form 110 of FIG. 5, for application on line 90 to the signal processing means 26. This optically generated analog data signal indicates the true reflectance at the particular scanning wavelengths of interest of the sample under analysis, and is thus precisely proportional in amplitude to the concentration of the particular sample constituent of interest, for example the amount of protein in wheat or the amount of fat in ice cream. Each four rotations of the sample beam mirror 30 will provide eight precise reflectance readings for each wavelength of each sample scan. Thus, and with sample beam mirror 30 rotated at, for example 2400 rpm, it will be clear that near instantaneous correction and averaging of the reflectance readings are provided with attendant maximization of the signal-to-noise ratio, and minimization of drift.

Waveform 110 is, of course, a multi-constituent signal containing reflectance information arranged serially in time, or multiplexed and, to that effect, will be seen to comprise eight equal time periods which are numbered as such in FIG. 5 and which, in terms of reference (R), sample (S) and dark (D) information content may be identified as shown as waveform segments RD1, R1, R2, RD2, SD1, S1, S2 and SD2, respectively; with the information of interest being provided in each instance by integration of the areas bounded by those waveform segments. Thus, and in terms of the basic reflectance equation as set forth hereinabove, it will be clear that the "reference" term is equal to $\int(R1+R2)$, the "sample" term is equal to $\int(S1+S2)$, the "reference dark" term is equal to $\int(RD1+RD2)$, and the "sample dark" term is equal to $\int(SD1+SD2)$. The transition points at which the waveform 110 switches over between the respective sample, reference, sample dark, and reference dark information content segments are also labeled on FIG. 5 as P1 through P9, respectively; it being noted that particularly precise and exact determination of these transition points in time is required to enable signal processing precisely in phase with waveform 110, and attendant provision of highly accurate sample analysis results by signal processing means 26 as described in detail hereinbelow. This is to say that in order to maintain the essential linearity vis-a-vis the basic reflectance equation between signal processing of the waveform 110 and actual concentration of the sample constituent of interest, it becomes imperative that the transition points under discussion be determined with a high degree of accuracy.

The generation of appropriate digital control signals which may be precisely aligned, i.e. phase locked, with waveform 110 of FIG. 5 by the signal processing means 26 to insure precise transition point determination in real time are the functions of the encoder 64 and reference/sample sensor 70 of FIG. 1; while the precise alignment, i.e. phase locking, in real time of those control signals with waveform 110 of FIG. 5 to insure precise transition point determination with attendant analysis data validation, and calculation of the sample analysis results from the thusly validated data, are the functions of the signal processing means 26.

This data signal-control signal alignment by the signal processing means 26 is made necessary by the fact that it is, as a practical matter, impossible to mechanically align sample beam mirror 30 and encoder disc 66 on motor shaft 32 with sufficient precision to insure the requisite, precise signal alignment. Thus, and in accordance with the teachings of this invention, no effort at such mechanical alignment need even be made attendant the attachment of encoder disc 66 to motor shaft 32. Instead, what in essence amounts to a process of precise self-alignment of the digital control signals from encoder 64 and reference/sample sensor 70, vis-a-vis the composite data signal 110 from detectors 82 and 84 of the integrating sphere 22, is performed by the signal processing means 26 in accordance with the teachings of this invention. Advantageously, this novel process of precise self-alignment is not sensitive to reasonable variations in the speed of drive motor 34 which are not uncommon in optical shopping systems; it being understood by those skilled in this art that control of the speed of drive motor 34 with sufficient precision to rule out any variation of substance would, in and of itself, be a particularly complex, difficult and expensive endeavor.

To better illustrate this essential alignment relationship between composite, analog data signal waveform 110 of FIG. 5 and the respective digital control signals from encoder 64 and reference/sample sensor 70 prior to detailed description of the overall operation of signal processing means 26, it may be understood that for use of a sample beam mirror 30 which divides the composite data signal waveform 110 of FIG. 5 as described into eight distinct data periods for each half revolution of drive motor 34, an encoder 64 which provides an angular position indication at every 22.5° of rotation is required. Thus, if an encoder disc containing, for example, 1024 lines for precision of operation is employed, this 22.5° of rotation would occur at every 64th line or encoder position.

This 1024 pulse per revolution encoder output signal is applied as indicated on line 72 in FIG. 6 to a bi-directional alignment change circuit 115 of the signal processing means 26, which operates to correct the alignment thereof vis-a-vis the data signal waveform 110 as required in the manner described in detail hereinbelow. The correctly aligned digital control signal is applied as indicated on line 117 from circuit 115 to variable ratio divider circuit 119, which comprises 4 stage counters 120 and 122 interconnected as shown by line 124, to result in the provision of a 16 pulse per revolution digital control signal as illustrated by waveform 126 of FIG. 7 on the ÷64 output line 128 of that circuit. Of course, were an encoder with a different number of angular position indications, for example 512, per revolution to be used, the inherent versatility of the divider circuit of FIG. 5 would equally well enable the provision of the desired 16 pulse per revolution digital control signal 126 of FIG. 7 through utilization of the ÷32 output line 130 of counter 122. This versatility would also enable the use of a sample beam mirror of configuration other and different than that depicted in FIG. 2C, for example one with a pattern that repeats 4 rather than 2 times per revolution of the motor shaft 32; which, in conjunction with a 1024 position encoder, could be employed through use of the ÷32 output 130 of counter 122.

Reference/sample sensor 70 of FIG. 1 operates concomitantly with sample beam mirror 30 and encoder 64 to provide a digital control signal as illustrated by waveform 132 of FIG. 8.

FIGS. 5, 7 and 8 are drawn to the same time scale; and FIGS. 5 and 7 depict the requisite, precise alignment, or phase locking, between the respective rising edges of the control signal 126 and the respective beginnings or transition points P1 through P8 of each of the periods 1 through 8 of the composite signal 110. Thus, for example, rising edge 134 of signal 126 occurs in point of time coincident with transition point P1 of signal 110 at the beginning of period 1 when the latter is centered in a dark position. In like manner, rising edges 136 and 138 of signal 126 occur in points of time respectively coincident with transition points P3 and P7 of signal 110 at the beginnings of periods 3 and 7 when the latter is centered in respective reference and sample positions. This same coincidence regarding the other rising edges of digital control signal 126, and the other transition points or beginnings of periods of composite optical signal 110 occur as shown when the latter is centered between dark and sample or reference positions, respectively. Waveform 132 of FIG. 8 has a rising edge 140 which occurs in point of time just prior to the transition of signal 110 from dark to reference, and a falling edge 142 which occurs in point of time just prior to the transition of signal 110 from dark to sample.

In many instances, however, this precise alignment between the respective rising edges of digital control signal 126 and the transition points of the composite analog data signal 110 will not occur, for reasons discussed hereinabove, upon the outputting of those control and data signals by encoder 64 and integrating sphere 22. The extent to which these parameters are out of alignment may be determined in terms of pulses of the encoder signal as applied to alignment change circuit 115 (FIG. 6), i.e. prior to the division as described of the encoder signal by divider circuit 119 to result in digital control signal 126 of FIG. 7, it being noted that in the given example with an encoder signal as applied to circuit 115 comprising 1024 pulses per revolution of motor shaft 32, each of the pulses of digital control signal 126 of FIG. 7 will be equivalent to 32 pulses of the undivided encoder signal.

This is illustrated by FIGS. 9 and 9A wherein a one transition point segment, only, of waveform 110 is drawn to the same time scale as a single 32 pulse group, only, of the undivided encoder signal waveform 129, and corresponding pulses of the divided encoder signal waveform 126, respectively, to depict two data signal-control signal misalignment conditions, and the quantification thereof in terms of undivided encoder signal pulses or counts. More specifically, FIG. 9 depicts a misalignment condition wherein the leading edge 131 of the leading pulse of the relevant 32 pulse undivided encoder signal pulse group is out of phase with waveform 110 in that it leads transition point P5 of waveform 110 in point of time by two undivided encoder signal pulses or counts. Conversely, FIG. 9A depicts a misalignment condition wherein the leading edge 133 of the leading pulse of the relevant 32 pulse undivided encoder signal pulse group is out of phase with waveform 110 in that it trails in point of time transition point P8 of waveform 110 by three undivided encoder signal pulses or counts as indicated in dashed lines. Accurate calculation of the sample analysis results from the data of waveform 110 under the misalignment conditions of FIG. 9 would not be possible because the last part in point of time of the reference dark data would be included in and processed as part of the immediately following sample dark data; and accurate sample analysis results calculation would not be possible under the misalignment conditions of FIG. 9A because the first part in point of time of the sample dark data would be included in and processed as part of the immediately preceding sample data.

Although the alignment errors in question may not always take the precise form of those depicted in FIGS. 9 and 9A wherein the data signal transition point is in alignment with the leading edge of one, albeit the wrong one, of the relevant pulse group of the undivided encoder signal 129, it will be clear that it will always be possible to quantify the misalignment to the nearest such pulse or count. Thus, the greater number of pulses per unit time in the undivided encoder signal, the greater the resolution, and thus accuracy, of the misalignment determination. For representative operation as disclosed with encoder 64 providing 1024 pulses per 360° of revolution of sample beam mirror 30, it will be clear than an alignment accuracy of ±0.35° can be provided.

Figure 10:
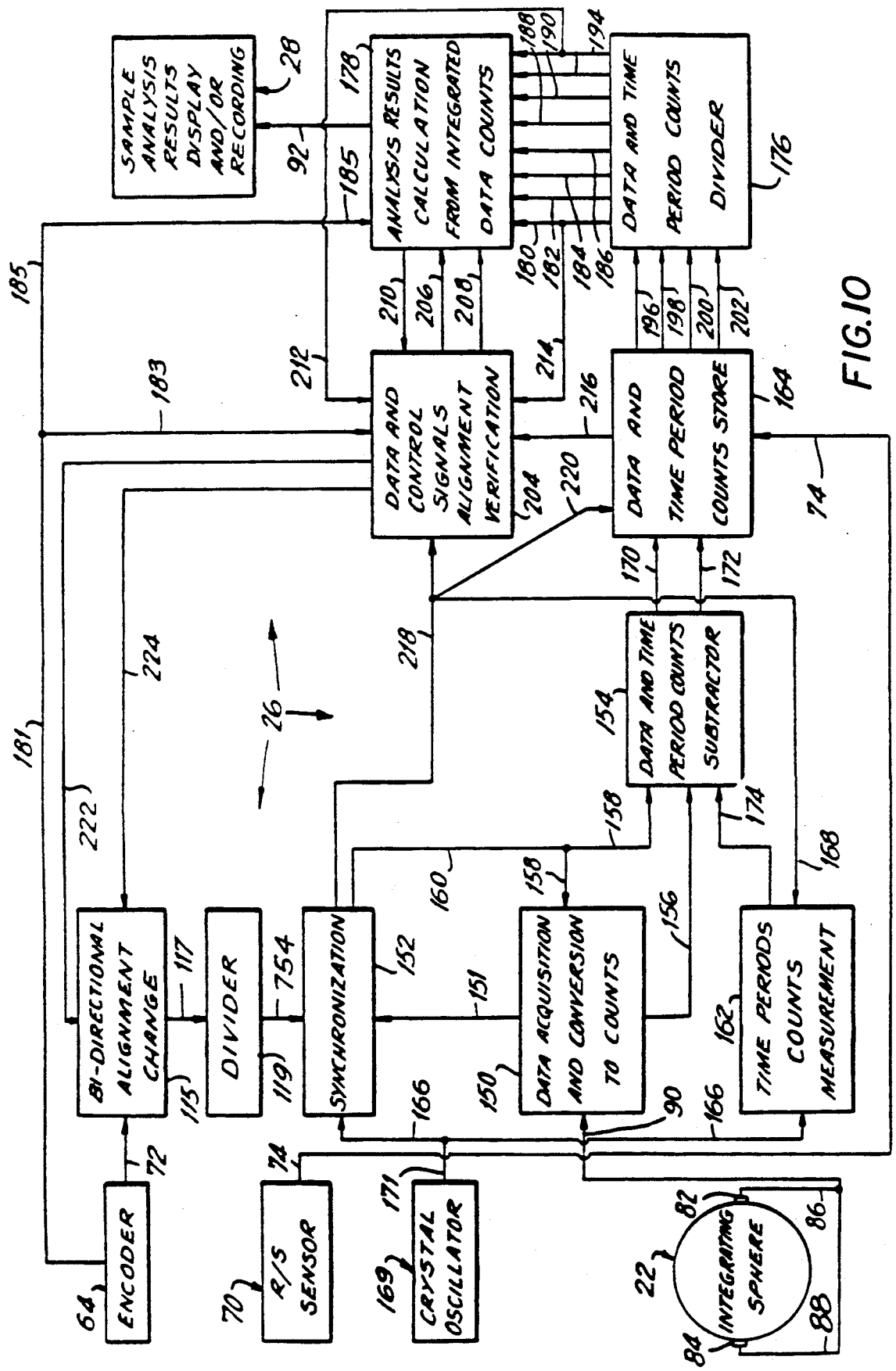
FIG. 10 is a logic diagram of the signal processing means of FIG. 1 drawn in conjunction with the relevant analysis apparatus components.

The signal processing means 26 are depicted in block diagram form in FIG. 10 in operative relationship with encoder 64, R/S sensor 70, integrating sphere 22 and display means 28, respectively. The signal processing means 26 comprise data acquisition and conversion circuit 150 to which the analog composite data signal 110 of FIG. 5 is applied on line 90. Circuit 150 is connected by line 151 to synchronization circuit 152, and to data and time period counts subtractor circuit 754 by lines 156 and 158; and line 160 connects line 158 to circuit 152. Variable ratio divider circuit 119 is connected to circuit 152 by line 154. Time period counts measurement circuit, and data and time period counts storage circuit, are indicated at 162 and 164, respectively. A crystal oscillator is indicated at 169, and the constant stable output therefrom is applied on line 171 to line 166 for application to circuits 152 and 162. The digital control signal 132 (FIG. 8) from R/S sensor 70 is applied on line 74 to circuit 164; and lines 170 and 172 connect circuits 154 and 164. Line 174 connects circuits 162 and 154. Data and time period counts division circuit, and analysis results calculation circuit, are indicated at 176 and 178, respectively, and lines 180, 182, 184, 186, 188, 190, 192 and 194 connect the same. Lines 181, 183 and 185 apply the signal from encoder 64 to circuits 204 and 178. Lines 196, 198, 200 and 202 connect circuits 164 and 176. Alignment verification circuit is indicated at 204, and lines 206, 208 and 210 connect the same to circuit 178. Lines 212 and 214 connect lines 180 and 194 to circuit 204, and line 216 connects circuits 164 and 204. Line 218 connects circuits 204 and 152, and lines 220 and 168 connect line 218 with circuits 164 and 162. Lines 222 and 224 connect circuits 115 and 204. The sample analysis results which are calculated from the verified data of composite data signal 110 (FIG. 5) are applied as indicated on line 92 from circuit 178 to displays means 28.

Figure 11:
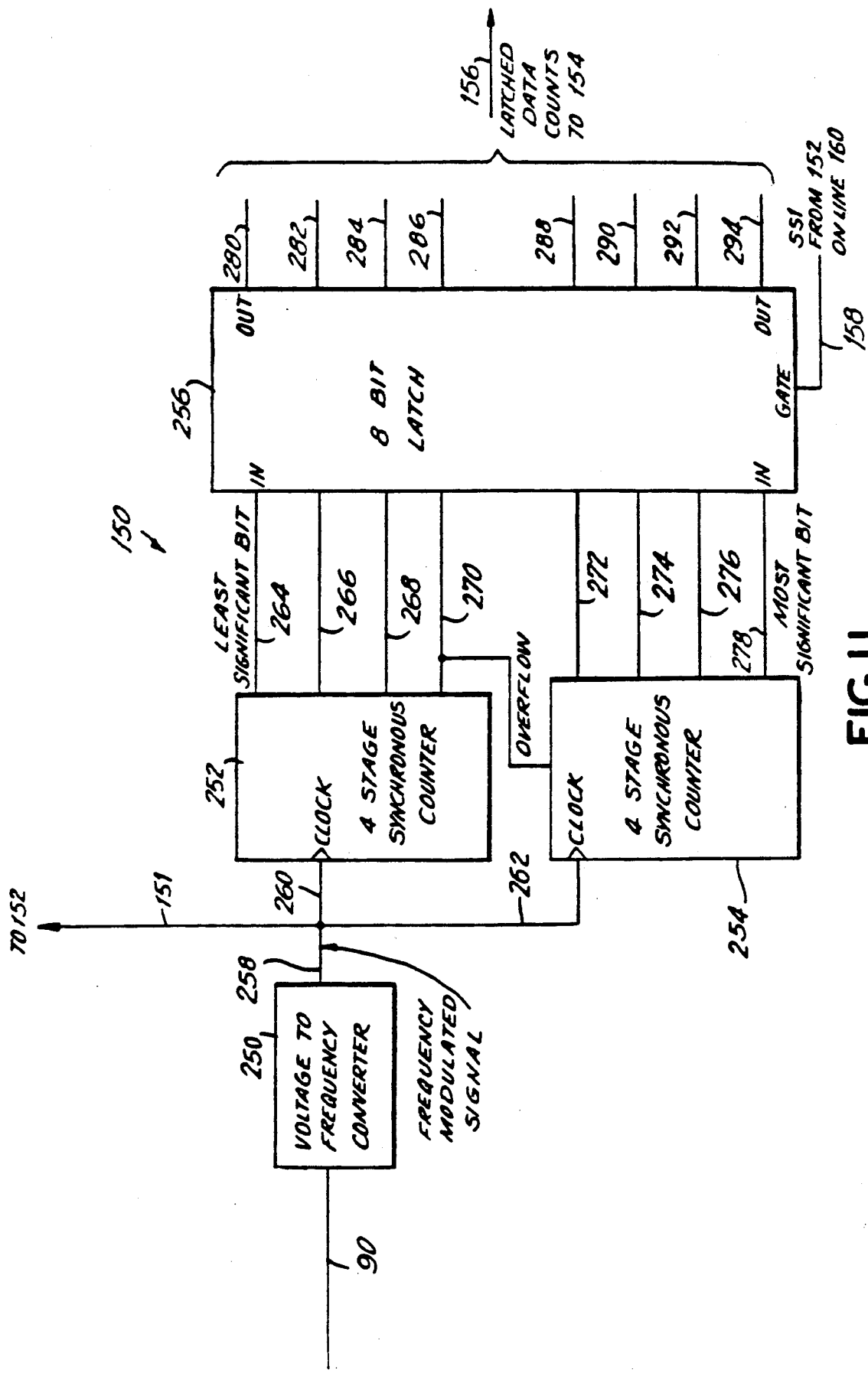
FIG. 11 is a circuit diagram of the data acquisition and conversion circuit of FIG. 10.

As seen in FIG. 11, the data acquisition and conversion circuit 150 comprises voltage to frequency convertor 250, 4 stage continuously operable synchronous counters 252 and 254, and 8-bit latch latch 256. The amplitude modulated analog signal 110 (FIG. 5) from integrating sphere detectors 82 and 84 is applied as indicated on line 90 to convertor 250 for conversion to a frequency modulated signal, and the latter is applied as indicated to counters 252 and 254 on lines 258, 260 and 262. This frequency modulated signal is also applied as indicated on line 151 to circuit 152. The counters operate to count the input pulses of the frequency modulated signal for a known period of time to result in the provision at the counter outputs 264, 266, 268, 270, 272, 274, 276 and 278 of digital values which are changing at a rate proportional to the amplitude of analog signal 110 of FIG. 5. These digital data values or counts are applied as indicated to latch 256 and are outputted therefrom on lines 280, 282, 284, 288, 290, 292 and 294 for application in sequence as indicated on line 156 to count and data subtractor circuit 154 under the control of the positive-going pulse edges of a first synchronized control signal SS1 which is applied as indicated as a gating signal from synchronization circuit 152 to latch 256 on line 158. Synchronized control SS1 is generated as described in detail hereinbelow by synchronization circuit 152 and indicates that the data count corresponding to periods 1 through 8 of data signal waveform 110 of FIG. 5 is latched, but that the corresponding time period count may not yet be available.

Figure 12:
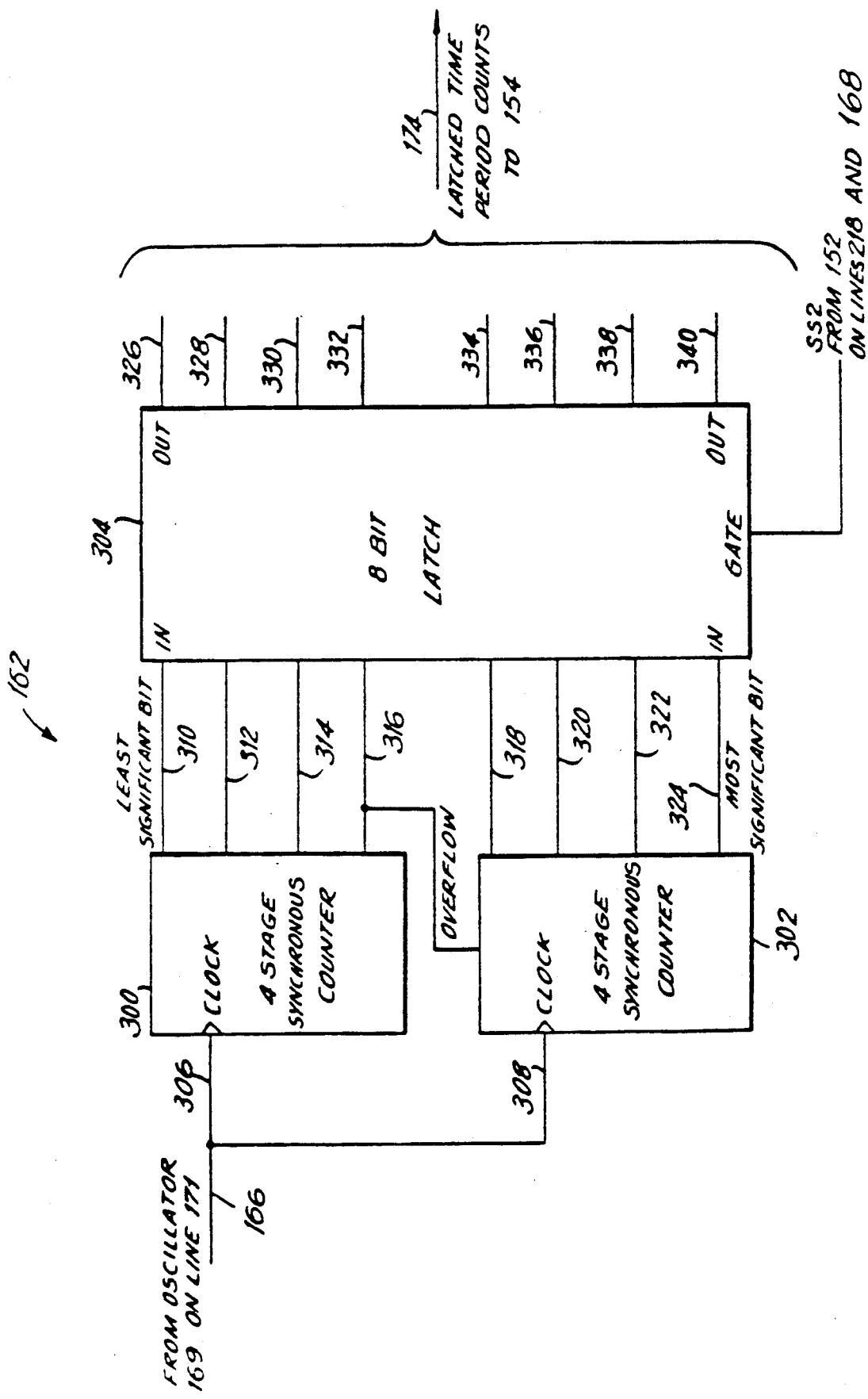
FIG. 12 is a circuit diagram of the time periods counts measurement circuit of FIG. 10.

Time period measurement circuit 162 may be seen in FIG. 12 to comprise 4 stage continuously operable synchronous counters 300 and 302, and 8-bit latch 304.

The constant stable output from oscillator 169 is applied as indicated on lines 306 and 308 to counters 300 and 302. The resultant time counts are applied on lines 310, 312, 314, 316, 318, 320, 322 and 324 to latch 304, and are outputted from the latter on lines 326, 328, 330, 332, 334, 338 and 340 for application in sequence as indicated on line 174 to the data and time count subtractor circuit 154 under the control of the positive-going pulse edges of a second synchronized control signal SS2 which is applied as indicated as a gating signal from synchronization circuit 152 to latch 304 on lines 218 and 168 (refer to FIGS. 10-12). Synchronization signal SS2 is generated as described in detail hereinbelow by synchronization circuit 152 to trail synchronization signal SS1 in time, and indicates that both the data and time period counts for the particular eight period data segment of interest have been latched and are available for calculation.

Figure 13:
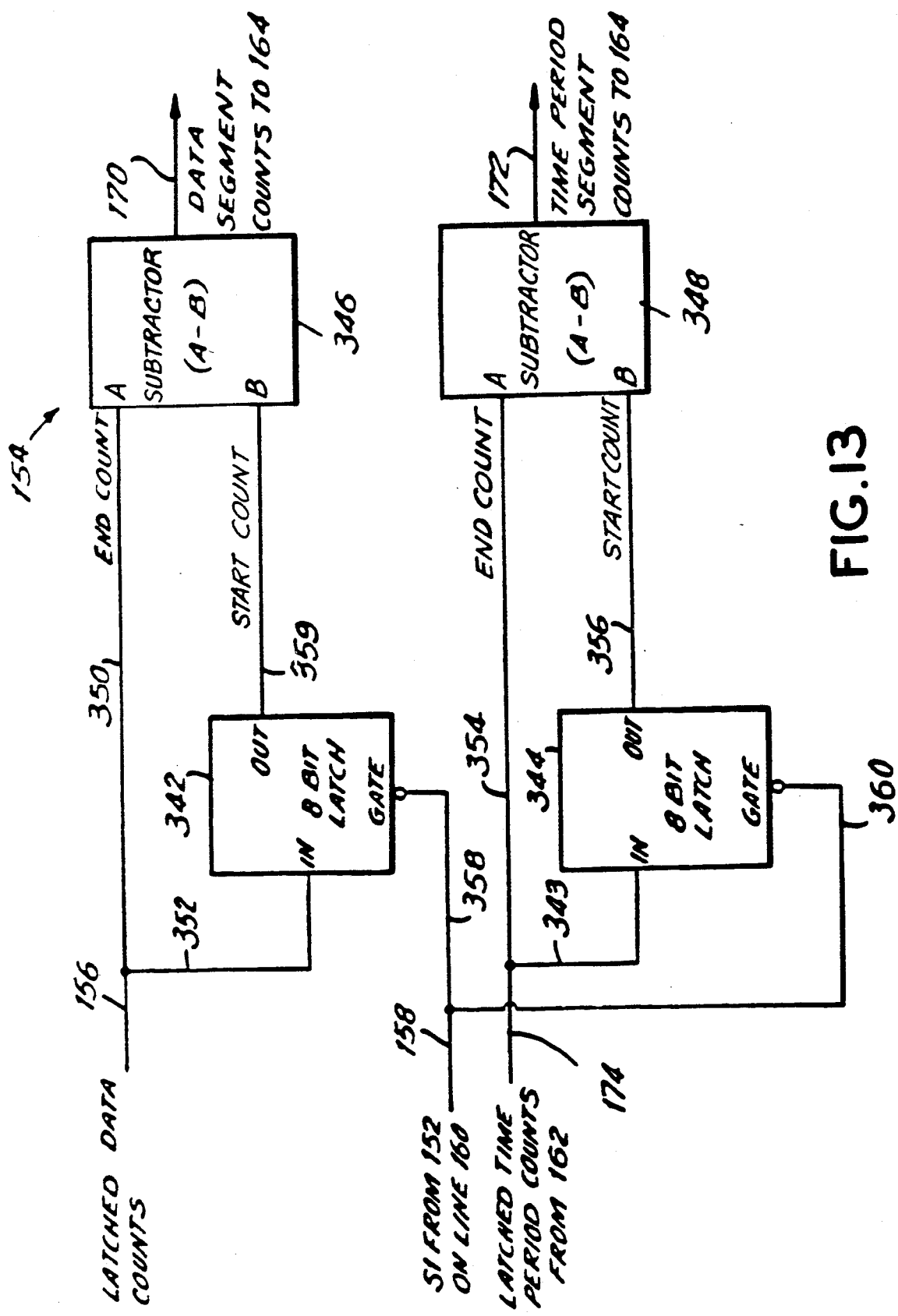
FIG. 13 is a circuit diagram of the data and time periods counts subtractor circuit of FIG. 10.

Data and time period count subtractor circuit 154 of FIG. 13 comprises latches 342 and 344, and subtractors 346 and 348, respectively. The latched data counts from latch 256 of FIG. 11 are applied as indicated in sequence to subtractor 346 as input A on line 350, but are not gated into the latch at this time. The current data counts are also applied on line 352 to latch 342. A similar count from the previous period was stored in latch 342 and is present on line 359. This stored count is the start count, while the current count on lines 156 and 350 is the end count. The latched time period counts from latch 304 of FIG. 12 are applied in sequence to subtractor 348 of input A on line 354; and are also applied on lines 343 to latch 344. Thus, the start counts remain latched in 342 and 344 until a negative going edge of signal SS1 appears on lines 358 and 360, at which time the end counts of the current period on lines 352 and 343 become the start counts on lines 359 and 356 for the next period which begins at the next positive going edge of SS1. The respective data and time period start counts are applied from latches 342 and 344, to subtractors 346 and 348 as the B inputs on lines 359 and 356. Under these circumstances, subtractors 346 and 348 will respectively function as indicated to subtract the start count from the end count for each of the eight data segments of waveform 110 (FIG. 5) in sequence to thus effectively integrate the respective areas under each of those waveform segments; while the subtractor 348 will function as indicated to subtract in sequence the start count from the end count for each of the eight time period count segments as determined by operation of time period measurement circuit 162 of FIG. 12 on the constant stable output of oscillator 169 to respectively correspond to those data segments, i.e. time periods 1 through 8 of FIG. 5. The resultant demodulated data segment counts, and corresponding time period counts are applied as indicated on lines 170 and 172 from subtractors 346 and 348 to the data and time period count storage circuit 164 of FIG. 14.

Figure 14:
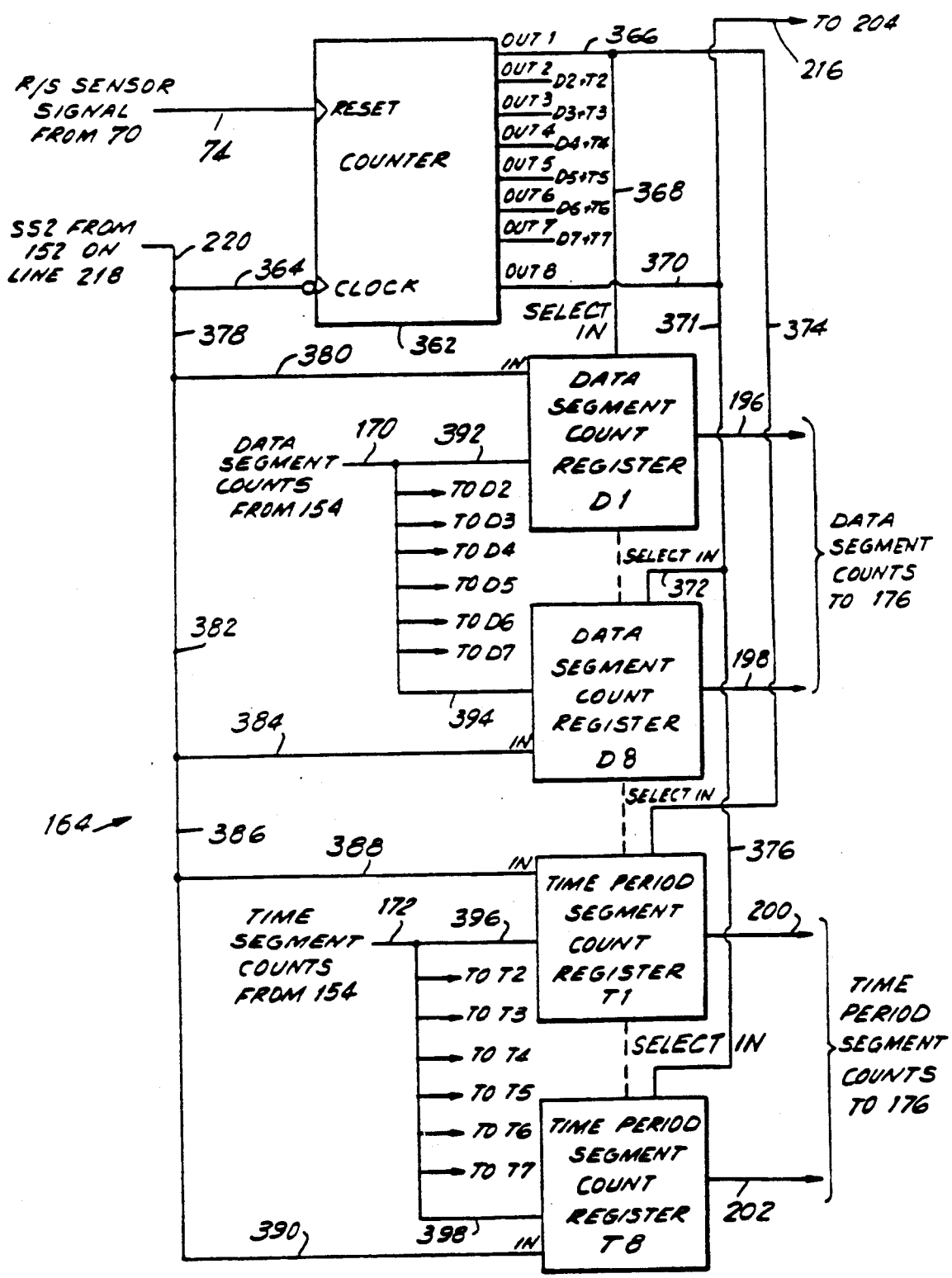
FIG. 14 is a circuit diagram of the data and time periods counts storage circuit of FIG. 10.

As seen in FIG. 14, circuit 164 comprises counter 362, eight free-running data segment count registers as illustrated by registers D1 and D8 and the dashed line connecting the same, and eight free-running time period segment count registers as illustrated by registers T1 and T8 and the dashed line connecting the same. Counter 362 is synchronized as indicated by the R/S sensor control signal 132 (FIG. 8) as applied thereto on line 74 to operate on the sequencing control signal SS2 as applied thereto on line 364. The eight counter outputs are applied as indicated in numerically corresponding sequence under the control of SS2 to the eight data segment count registers D1 through D8 as fully illustrated only for registers D1 and D8 by lines 366, 368, 370, 371 and 372; and are applied as indicated in numerically corresponding sequence under the control of SS2 to the eight time period segment registers T1 through T8 as fully illustrated only for registers T1 and T8 by lines 374 and 376. The synchronized control signal SS2 is applied as indicated to the eight data segment count registers T1 through T8, as fully illustrated only for registers D1, D8, T1 and T8, by lines 378, 380, 382, 384, 388 and 390, respectively.

The data segments counts from subtractor 346 of FIG. 13, and the time period segment counts from subtractor 348 of FIG. 13 are respectively applied in sequence as indicated under the control of the counter outputs and synchronization signal SS2 to registers D1 through D8 and T1 through T8 as fully illustrated only for registers D1, D8, T1 and T8 by lines 392, 394, 396 and 398. Thus, at the completion of one sequence of operation, i.e. one half rotation of sample beam mirror 30 of FIG. 1 which results in the provision of the sample data illustrated by the waveform 110 of FIG. 5, the data information for each of the eight segments of that waveform now in digital form will be stored in the correspondingly numbered one of the data segment count registers D1 through D8. In like manner, the time period information for each of the eight time periods 1 through 8 of FIG. 5 will be stored in digital form in the correspondingly numbered one of the time period segment registers T1 through T8. These now demultiplexed data and time period counts may then be applied as indicated by lines 196 and 198 for registers D1 through D8, and lines 200 and 202 for registers T1 through T8, to the data and time periods counts divider circuit 176 of FIG. 15.

Figure 15:
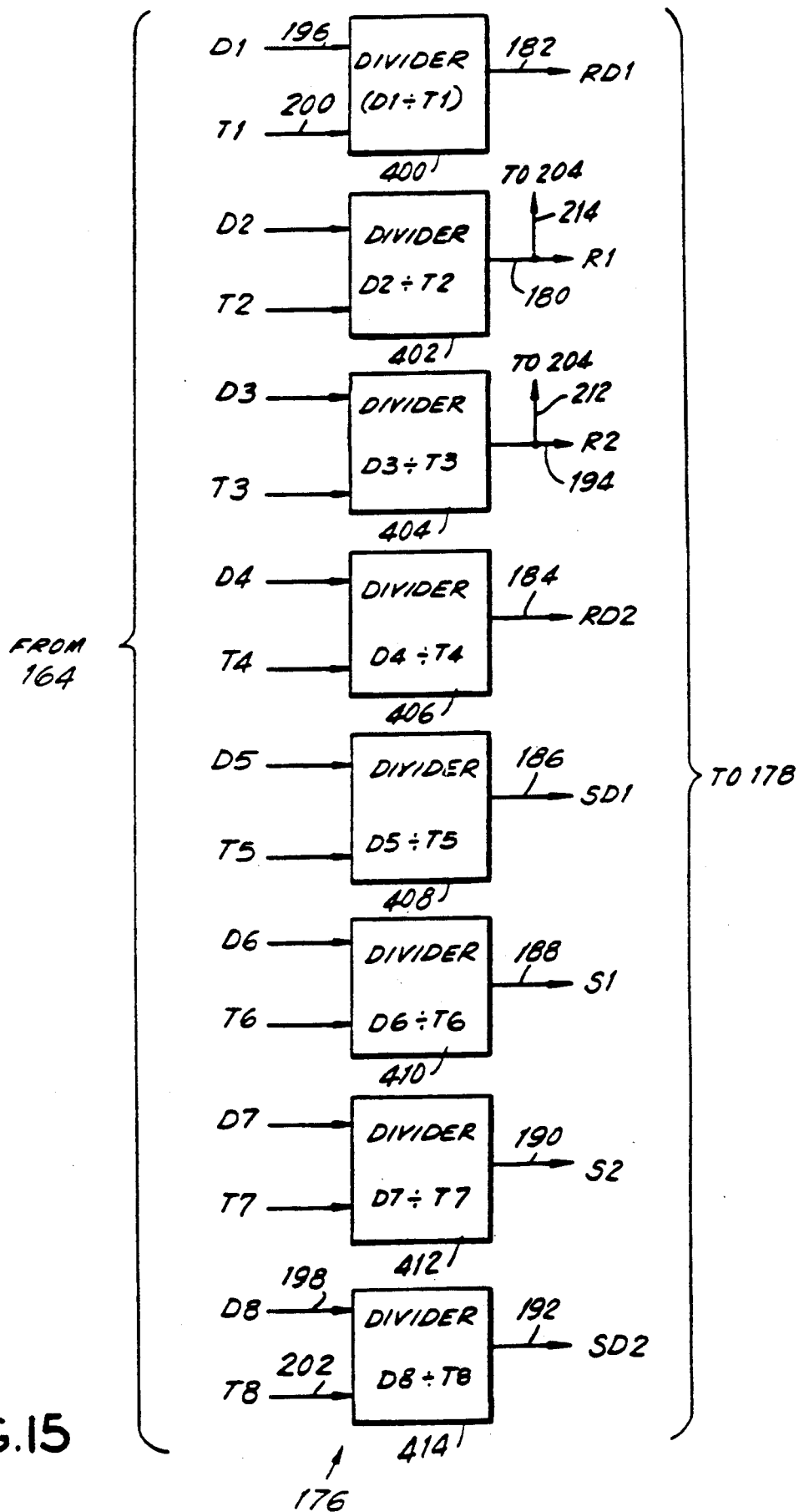
FIG. 15 is a circuit diagram of the data and time period counts divider circuit of FIG. 10.

The divider circuit 176 of FIG. 15 comprises eight dividers as indicated at 400, 402, 404, 406, 408, 410, 412 and 414, respectively. The data segment counts from registers D1 through D8 of FIG. 14 and the time period segment counts from registers T1 through T8 of FIG. 14 are respectively applied in pairs as indicated to these dividers. This results in data count/time period count division in each instance, and the provision as indicated at the divider outputs in digital form of the normalized, i.e. same time base related, integrations in terms of data counts per time count of the respective areas under the RD1, R1, R2, RD2, SD1, S1, S2 and SD2 segments of the composite analog data waveform 110 of FIG. 5; for application as indicated on lines 180, 182, 184, 186, 188, 180, 192 and 194 to the analysis results calculation circuit 178 of FIG. 16 and, in the case of the R1 and R2 values, also to alignment verification circuit 204 on lines 212 and 214.

Figure 16:
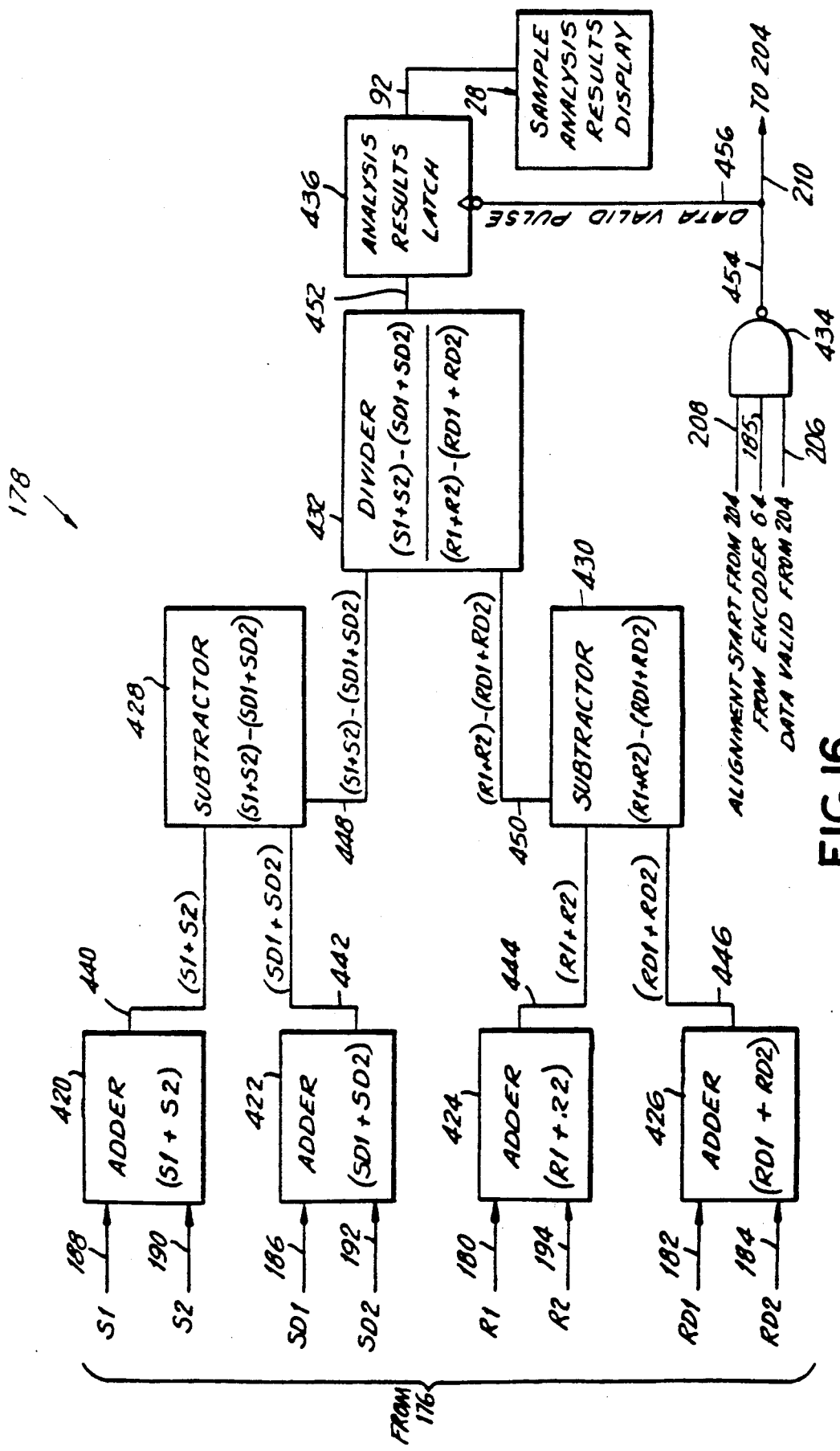
FIG. 16 is a circuit diagram of the sample analysis results calculation circuit of FIG. 10.

FIG. 16 depicts the calculation circuit 178 to comprise adders 420, 422, 424 and 426, subtractors 428 and 430, divider 432, gate 434 and latch 436, respectively. The S1 and S2, SD1 and SD2, R1 and R2, and RD1 and RD2 values from the divider circuit 176 are applied as indicated in pairs on lines 188 and 190, 186 and 192, 180 and 194, and 182 and 184, respectively, to adders 420, 422, 424 and 426; and the resultant (S1+S2), (SD1+SD2), (R1+R2) and (RD1+RD2) value sums are applied in pairs as indicated on lines 440, 442, 444 and 446 for subtraction to subtractors 428 and 430. The resultant (S1+S2)−(SD1+SD2) and (R1+R2)−(RD1+RD2) value differences are applied as indicated on lines 448 and 450 for division to divider 432; and the resultant value quotient, which is indicative of the true reflectance as discussed hereinabove, is applied as indicated to analysis results latch 436 on line 452.

Latch 436 is controlled as indicated by gate 434 on lines 454 and 456, and is only operable to change the data on line 92 which is applied as indicated to sample and analysis results display means 28 when pulsed to that effect as indicated by a data valid pulse on lines 454 and 456. Gate 434 is only enabled to pulse latch 436 on a negative going edge of an undivided encoder pulse from encoder 64 as applied thereto on line 185 when both alignment start and data valid lines 206 and 208 are at logic level 1, or "on" in response to operation of alignment verification circuit 204 as described in detail hereinbelow. Thus, only valid data is passed to display means 28 from latch 436.

Figure 17:
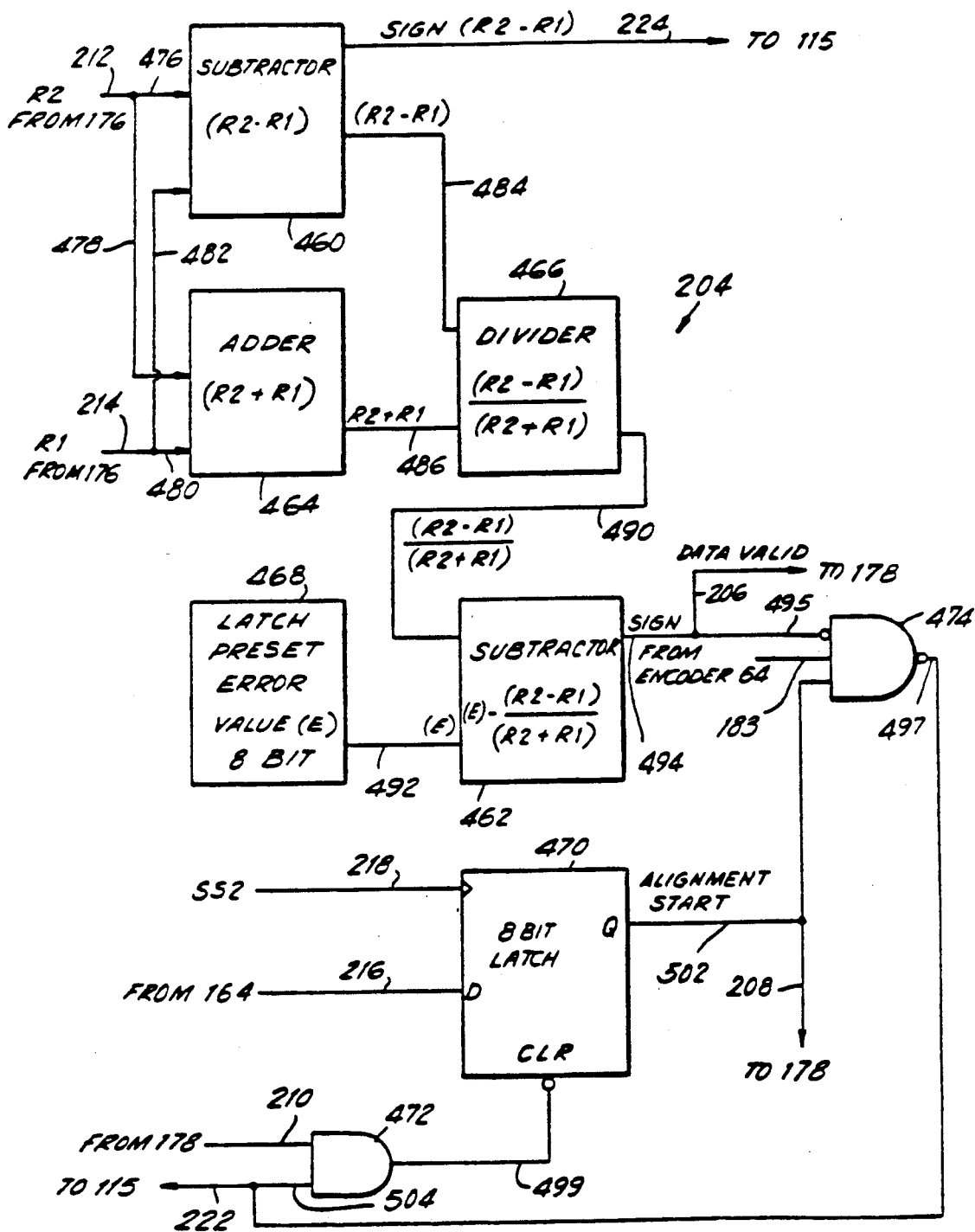
FIG. 17 is a circuit diagram of the alignment verification circuit of FIG. 10.

The alignment verification circuit 204 of FIG. 17 comprises subtractors 460 and 462, adder 464, divider 466, pre-set latch 468, latch 470 and gates 472 and 474, respectively. The normalized integration count values for R2 and R1 are respectively applied for comparison as indicated from dividers 404 and 402 of divider circuit 176 (FIG. 15) on lines 212, 214 476, 478, 480 and 482 to subtractor 460 and adder 464. The absolute value of the resultant difference, if any, and the resultant sum, are respectively applied as indicated on lines 484 and 486 to divider 466; while the sign of the difference is applied as indicated on line 224 to alignment change circuit 115 for purposes described in detail hereinbelow. The quotient, if any, of these difference and sum values is applied to subtractor 462 on line 490 for subtraction as indicated from the preset error value (E) which is applied to subtractor 462 from latch 468 on line 492; and the sign of that difference, if any, is applied from subtractor 462 on line 494. If, and only if, the sign is positive to indicate that the quotient value of interest from divider 466 is less than or equal to the preset error counts value (E) to thereby verify the validity of the sample analysis data insofar as alignment is concerned, a positive-going data valid pulse is applied as indicated on line 206 to gate 434 of calculation circuit 178 of FIG. 16 and is applied as indicated on line 495 to inhibit gate 474 to prevent pulse transmission under these data valid conditions to either of gate 472, or circuit 115.

By the above is believed made clear that this verification procedure insures that the respective constant, i.e. independent of sample reflectance characteristics, R1 and R2 count values, as effectively normalized through determination as described of the relative term (R2−R1)/(R2+R1) which is essentially independent of the actual light energy into the sample, are precisely compared with the preset error count value (E); it being clear that R2−R1, or vise versa, are precisely indicative of the actual alignment error, if any, between analog data signal waveform 110 and digital control signal waveform 126 of FIGS. 5 and 7, respectively. This is to say that with perfect alignment as depicted in FIGS. 5 and 7 between transition points P2, P3 and P4 of waveform 110, and leading edges 496, 136 and 498 of waveform 126, the respective areas under curve segments R1 and R2 of the former should be symmetrical, and thus equal, to result in like equality between the R1 and R2 count values which represent the results of the integrations of those waveform segment areas. Thus, lack of variation between the R1 and R2 count values in excess of that allowed by the preset error counts value (E) assures sample analysis data alignment and validity.

The outputting as described from subtractor 462 of a positive-going data valid pulse is accompanied in time by the application to latch 470 of the synchronization signal SS2 from circuit 152 on line 218, and the "OUT 8" pulse from counter 362 of FIG. 14. This results in the application from latch 470 of an alignment start pulse on line 502 for application as indicated on line 208 to gate 434 of calculation circuit 178 of FIG. 16 which, in conjunction with the data valid and encoder pulses, enables that gate to pulse display latch 436 (FIG. 16) for data display and/or recording as described.

If the data is invalid to result as described in a negative-going pulse from subtractor 462, line 206 will be at logic 0, or "off," and thus incapable of enabling display latch gate 434 of FIG. 16 thereby preventing the display of invalid data. This condition will, however, enable gate 474 to apply a trigger pulse for purposes described hereinbelow to circuit 115 on lines 497 and 222, and to apply that pulse on line 504 to gate 472 to enable the same to clear latch 470 as indicated on line 499.

Figure 18:
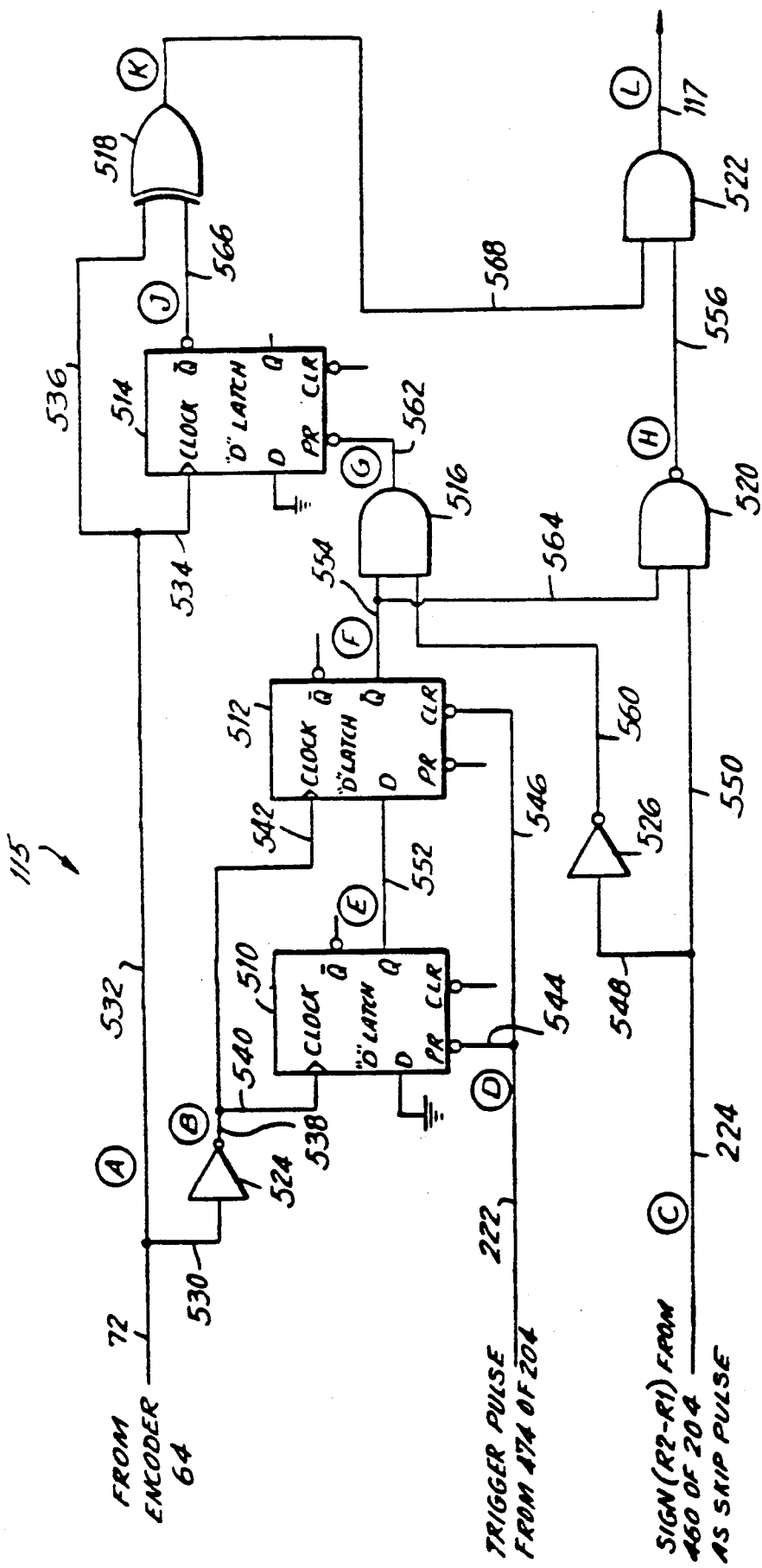
FIG. 18 is a circuit diagram of the alignment change circuit of FIG. 10.
Figure 19:
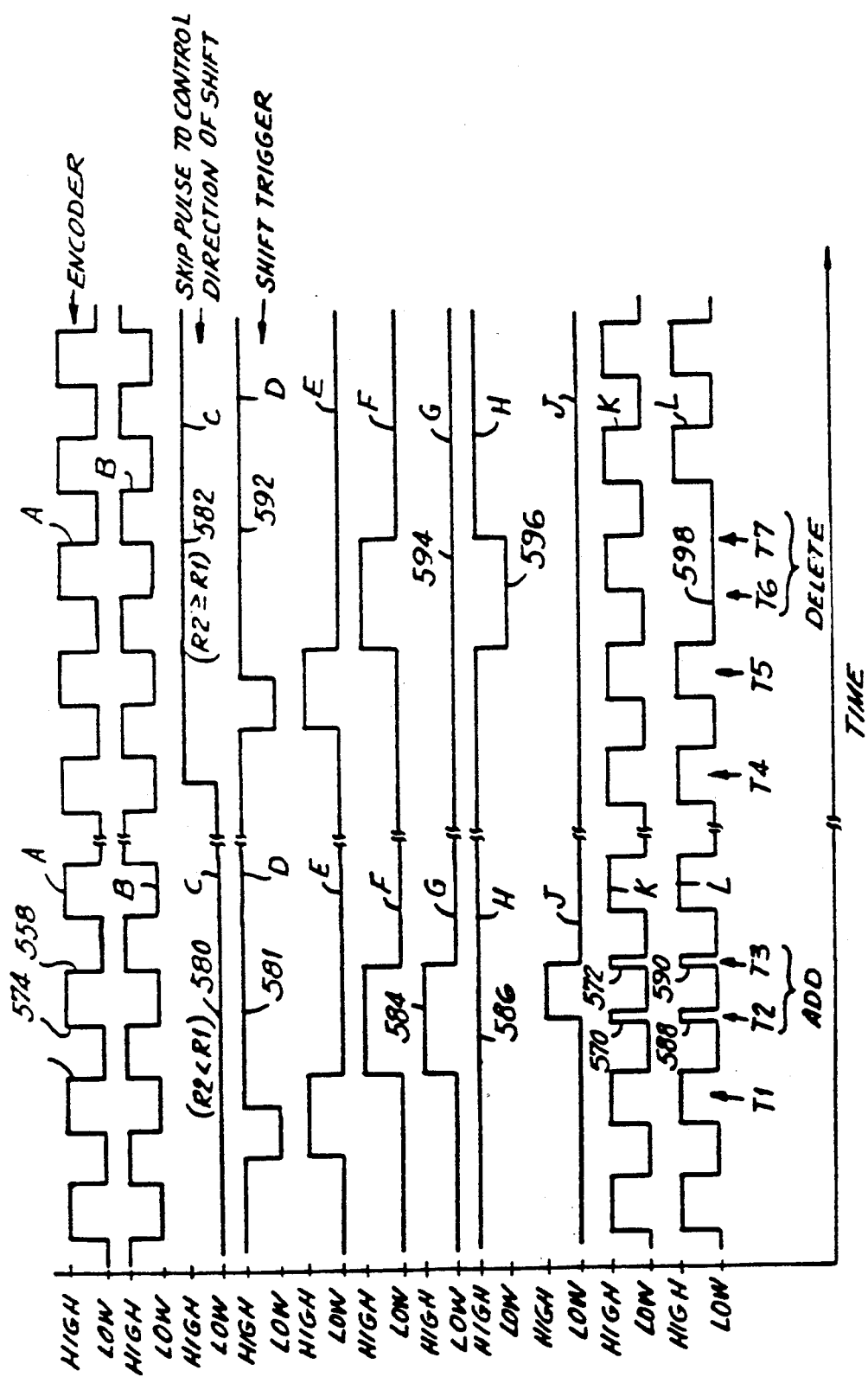
FIG. 19 is a timing diagram for the operation of the circuit of FIG. 18.

The bi-directional alignment change circuit 115 of FIG. 18 comprises latches 510, 512 and 514, gates 516, 518, 520 and 522, and inverters 524 and 526, respectively. A timing diagram depicting the operation of circuit 115 to correct two distinct misalignment conditions is shown by FIG. 19 and illustrates logic level pulse train waveforms or signals A, B, C, D, E, F, G, H, J, K and L drawn to the same time scale; and these same signal-identifying letters will be seen to appear at the appropriate locations on the circuit diagram of FIG. 18 for completeness of description.

As depicted in FIG. 18, latches 510 and 512 are configured so that the logic levels at the respective preset and clear latch inputs have the highest priority regarding the logic levels at the latch outputs. Thus, and regarding latch 510, it may be understood that with the preset latch input at logic level 0, or "low" (hereinafter simply "low"), the latch output will be at logic level 1, or "high" (hereinafter simply "high"). Conversely, with the preset latch input high, the logic level at the latch output will be determined by that at the clock and/or data inputs of latch 510. Regarding latch 512 it may be seen that with the clear latch input low, the latch output goes low; while, with the clear latch input high, the latch output will be determined by the latch clock and data inputs. In each instance, the respective clock inputs of latches 510 and 512 are operable to sense the positive-going edges of pulse signals and to only transmit data at those positive-going edges. Thus, data transfer by latches 510 and 512 can be precisely synchronized at predetermined points in time.

The undivided encoder pulse signal A is applied as indicated from line 72 to inverter 524 on line 530, to latch 514 on lines 532 and 534, and to gate 518 on line 536, respectively. The thusly inverted encoder pulse signal B appied as indicated on 538, 540 and 542 to latches 510 and 512. The trigger pulse signal D is applied as indicated from line 224 to latches 510 and 512 by lines 544 and 546; and the sign (R2−R1) or skip pulse C is applied as indicated from line 224 to inverter 526 and gate 520 by lines 548 and 550. Thus, with signal D at logic level 0, or "low" (hereinafter "low") as applied to latch 513 on line 544, signal E as outputted from latch 510 on line 552 will be at logic level 1 or "high" (hereinafter "high"), while signal F as outputted from latch 512 on line 554 will be low. These conditions continue so long as signal D remains low.

When signal D goes high, both latches 510 and 512 come under the control of the rising edge of that signal to thus effectively synchronize circuit 115 with the trigger pulse signal D, and enable the generation of signal F on line 554 which is synchronized with the encoder signal A. This is to say that the period of those signals will be the same, with the period of signal F extending in time as made clear by FIG. 19 from falling edge 756 to the following falling edge 558 of signal A.

With skip pulse signal C low, thus indicating a misalignment condition wherein R2 is less than R1 as illustrated at 580 in FIG. 19, and applied as indicated in line 548 to inverter 526, a high level will be applied to gate 516 on line 560 thereby, in conjunction with a high signal F, enabling that gate for application of a high signal G to latch 514 on line 562. With skip pulse signal C high, thus indicating a possible misalignment condition wherein R2>R1 as illustrated at 582 in FIG. 19, gate 516 is not enabled whereby signal G is driven low, while signal F now operates as indicated on line 564 to enable gate 520 in conjuction with a high signal C on line 550, thereby resulting in the inversion of the high signal F into low signal H on line 556 for application to gate 522.

With skip signal C low, trigger signal D high, and signal G high, as respectively illustrated at 580, 581 and 584 in FIG. 19, latch 514 is activated and, in conjunction with gate 518 through application to the latter of a high signal J on line 566, forms a frequency doubler sub-circuit which adds pulses 570 and 572 on signal K at both the high and low going edges 574 and 558 of encoder signal A. The pulses are passed on line 568 through gate 522, as enabled by a high signal H as shown at 586, and added as shown at 588 and 590 to undivided encoder signal L for application to counters 120 and 122 of divider circuit 119 of FIG. 6 on line 117. Thus, those counters will gain one count every time the trigger signal D is pulsed to a high logic level whereby the leading edge 136 of the divided encoder signal 126 of FIG. 7 will be advanced in time into alignment with transition point P3 of the data signal waveform 110 of FIG. 5.

Conversely, with skip signal C high, trigger signal D high, and signals G and H low, as respectively illustrated at 582, 592, 594 and 596 in FIG. 19, latch 514 is retained inactive and signal J is maintained low on line 566, thus enabling signal A on line 536 to pass unaltered through gate 518 for application as signal K on line 568 to gate 522. However, the disabling of gate 522 by a low signal H every time trigger pulse signal D goes high will result in the deletion of a pulse from signal K as indicated at 598 for signal L. Thus, application of the undivided encoder signal L under these conditions to counters 120 and 122 (FIG. 6) will result in the same losing one count every time the trigger signal D is pulsed to a high logic level. Accordingly, the leading edge 136 of the divided encoder signal 126 of FIG. 7 will be retarded in time into alignment with transition point P3 of the data signal waveform 110 of FIG. 5.

Of course, alignment of the respective signals 110 and 136 of FIGS. 5 and 7 within the prescribed error limit (E) will, as described hereinabove with regard to alignment verification circuit 204 of FIG. 17, inhibit gate 474 of that circuit to prevent the application of a trigger pulse signal D to circuit 115 of FIG. 18 on line 222. Under these conditions there will be no trigger pulse D whereby lines 544 and 546 of circuit 115 will remain at a low logic level and signal A will pass unaltered as progressively signals K and L on lines 532, 536, 568 and 117 through gates 518 and 522, as enabled by a high signal H, for application to counters 120 and 122 of the divider circuit 117 of FIG. 6.

By the above is believed made clear that the alignment modification circuit 115 of FIG. 18 will effectively function to insure the alignment, within the prescribed error limit (E) of the optically generated analog analysis data signal 110 of FIG. 5 and the encoder-generated digital control signal 126 of FIG. 7 by in essence digitally phase locking the latter to the former.

Figure 6:
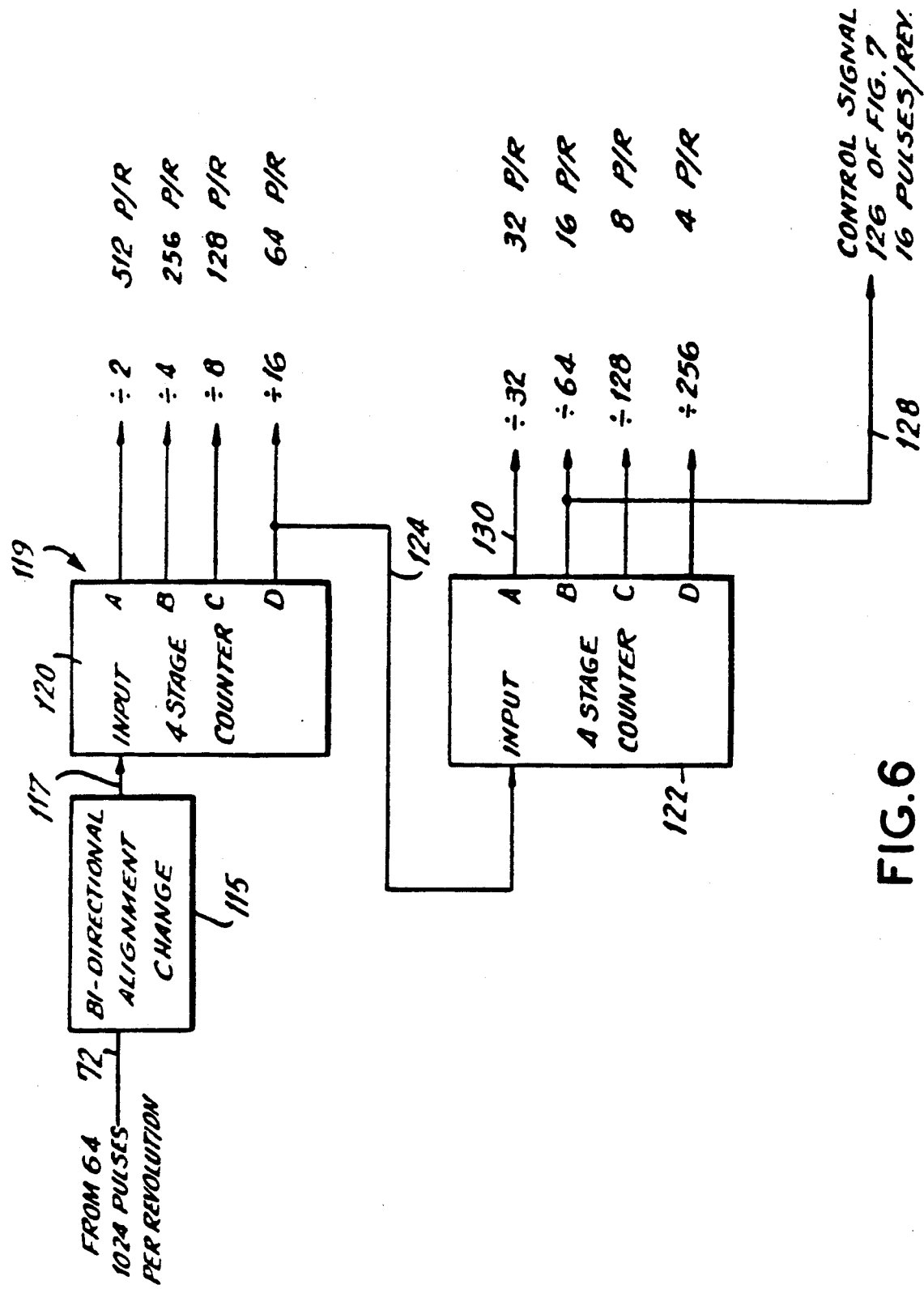
FIG. 6 is a circuit diagram of the divider circuit of the signal processing means of FIG. 1.
Figure 20:
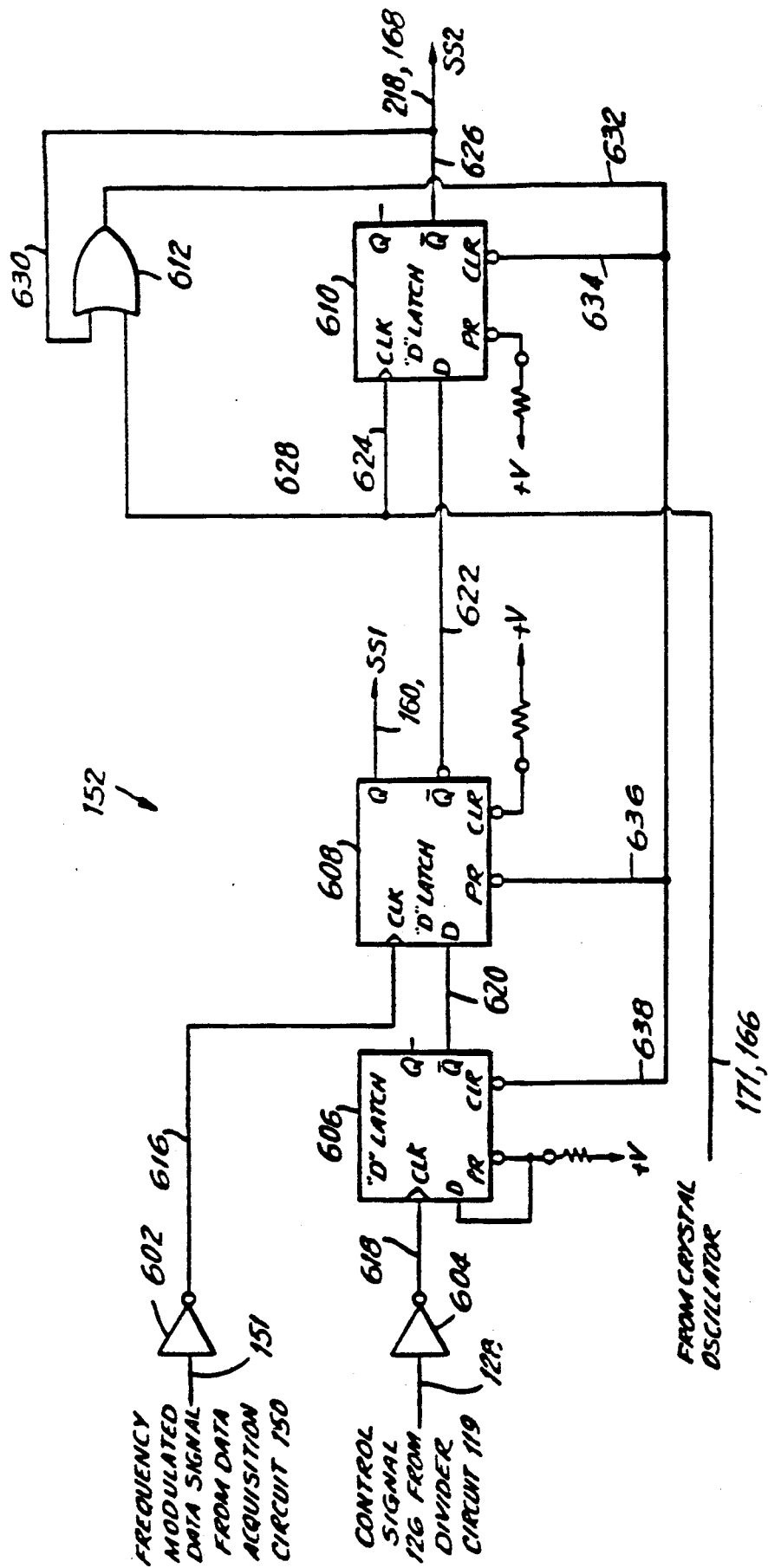
FIG. 20 is a circuit diagram of the synchronization circuit of FIG. 10.

As illustrated in FIG. 20, the synchronization circuit 152 comprises inverters 602 and 604, latches 606, 608 and 610, and gate 612, respectively; and is required by the assynchronous relationship between the rising edges of the aligned digital control signal 126 of FIG. 7 as outputted from the divider circuit 119 of FIG. 6, and the rising edges of the respective "clock" signals as applied to the counters 252 and 254 of the data acquisition and conversion circuit 150 o FIG. 11, and the counters 300 and 302 of the time period counts measurement circuit 162 of FIG. 12. This assynchronous relationship, unless corrected for, can result in loss of a count with attendant adverse effect on sample analysis accuracy because conversion as described of the optically generated amplitude or voltage modulated data signal 110 of FIG. 5 to a frequency modulated signal would dictate that loss of a count, for example, during a "dark" data signal period of low frequency upon conversion would have disproportionate effect when compared, for example, to loss of a count during a "reference" data signal period of relatively higher frequency. Synchronization circuit avoids this possible loss in sample analysis accuracy by synchronizing the latching of the data and time periods pulse counts with the falling edges of the clock signals while nonetheless enabling signal pulse counting to occur on the rising edges of the same.

More specifically, and as seen in FIG. 20, the frequency modulated data signal is applied on line 151 to inverter 602 for application inverted on line 616 as indicated to latch 608. Concomitantly, the aligned digital control signal is applied on line 128 to inverter 604 for application inverted as indicated to latch 606 on line 618. The application as indicated of the output of latch 606 on line 620 to the data input of latch 608 combined with the application as described of the inverted frequency modulated data signal to the clock input of the latter results in the outputting as indicated by latch 608 of the first synchronized control signal SS1. This signal is applied as described hereinabove on lines 160 and 158 as a gating signal to 8 bit latch 256 of the data acquisition and conversion circuit 150 of FIG. 11 thus indicating that the sample analysis data counts for each period of the eight period cycle of operation are complete and ready for further processing.

The constant stable pulse output from crystal oscillator 169, and the inverted output from latch 608, i.e. SS1 inverted, are applied as indicated on lines 166, 624 and 622 to the respective clock and data inputs of latch 610. This results in the outputting as indicated by latch 610 on line 626 of the second synchronized control signal SS2 for application on lines 218 and 168 as described hereinabove as a gating signal to 8 bit latch 304 (see FIG. 12) of the time periods counts measurement circuit 162 of FIG. 12, thus indicating that the time period counts for each period of the eight period cycle of operation under discussion are complete and ready for further processing. In addition, the oscillator output and second synchronization signal SS2 ar applied as indicated on lines 628 and 630 to gate 612 for feed-back application of signal SS2 as indicated on lines 632, 634, 636 and 638 to the respective clear, preset and clear lines of latches 610, 608 and 606.

Figure 21:
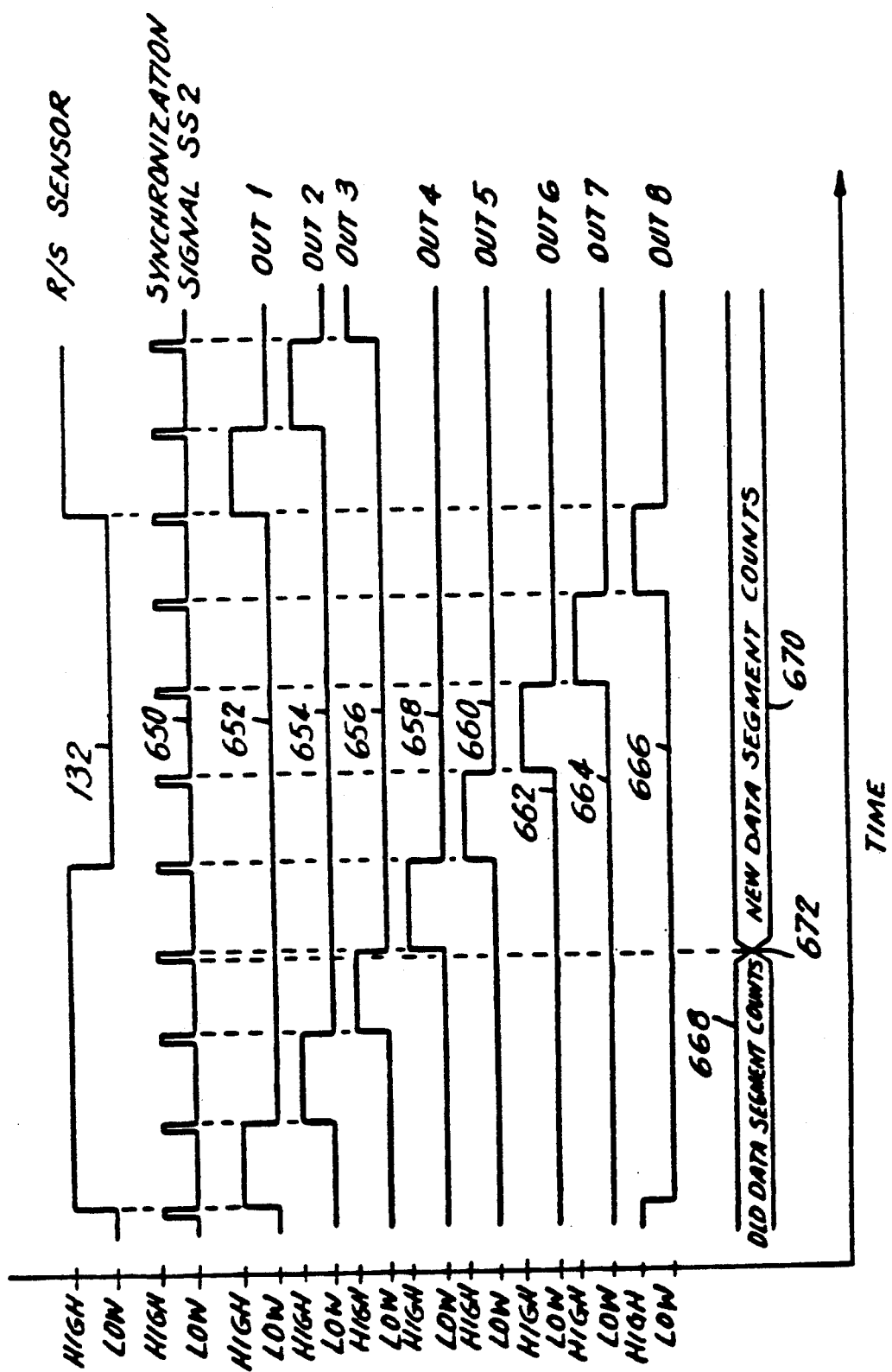
FIG. 21 is a timing diagram for the operation of the circuit of FIG. 14.

A timing diagram regarding the operation of the data and time period counts store circuit 164 of FIG. 14 is depicted in FIG. 21 and shows the R/S signal 132, and the logic level pulse train waveforms for synchronization signal SS2 and for the eight outputs OUT 1 through OUT 8 of counter 362, as respectively indicated at 650, 652, 654, 656, 658, 660, 662, 664 and 666, all drawn to the same time scale. As made clear by the dashed lines which connect various of these waveforms to indicate points which are coincident in time, each low going edge of the synchronized control signal SS2 as applied to the clock input of counter 362 on lines 220 and 364 (FIG. 14) functions to sequence that counter and drive the succeeding counter output high while returning the then active counter output to the low logic level. This operation is synchronized as shown by the R/S control signal 132 which alternates as shown between the low and high logic levels to go high coincident with the low going edge of every eighth pulse of the synchronization signal 132, and which is applied to those purposes as indicated on line 74 as the reset input to counter 362 of FIG. 14. Of course, after each of the counter outputs OUT 1 through OUT 8 is driven high as described, the same will, in conjuction with the next high going edge of synchronization signal SS2, operate the correspondingly numbered ones of the data segment count and time period segment count registers D1 through D8 and T1 through T8 to replace the data and time period counts then on the register outputs by the succeeding data and time period counts from the subtractors 346 and 348 of subtractor circuit 154 of FIG. 13 on lines 170 and 172. This is illustrated for data segment count register D3, only, in FIG., 21 wherein the "old" data segment counts are depicted at 668, and the "new" data segment counts are depicted at 670; it being made clear that the data segment counts on the output of register D3 will transition as indicated at 672 from the "old" to the "new" data segment counts at the point in time coincident with a high going edge of synchronization signal SS2 and with a high logic level on output line OUTG 3 of counter 362. These data segment counts will then remain on the register output until the next coincidence in time between a high OUT 3 from counter 362 and a high going edge of synchronization signal SS2.

Figure 22:
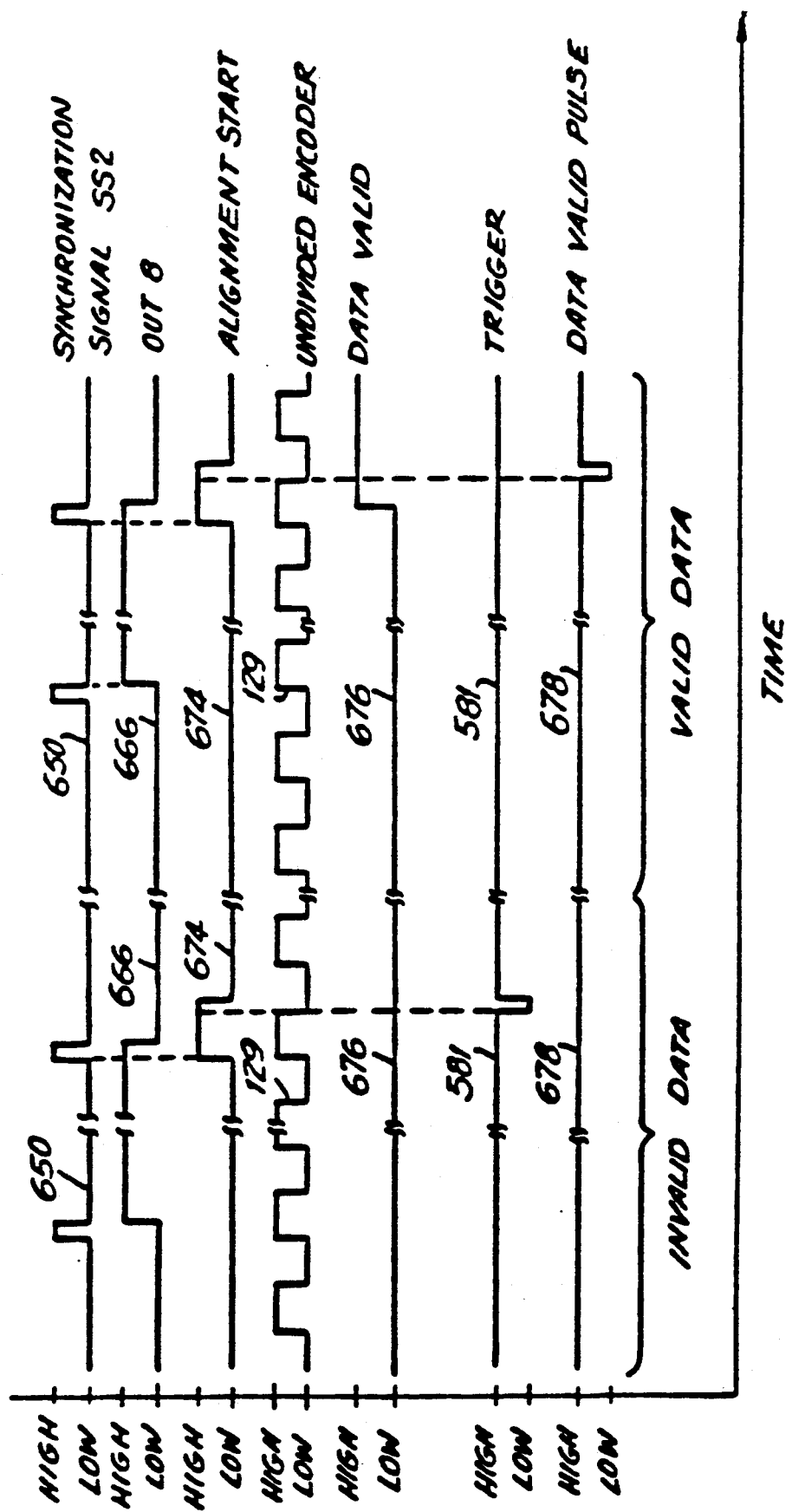
FIG. 22 is a timing diagram for the operation of the circuits of FIGS. 16 and 17.

A timing diagram regarding the operation of the analysis results calculation and alignment verification circuits 178 and 204 of FIGS. 16 and 17 is depicted in FIG. 22 and shows the logic level pulse train waveforms for invalid and valid data conditions for the synchronization signal SS2 on line 218, the OUT 8 output from counter 362 (FIG. 14) on line 216, the alignment start signal on lines 502 and 208, the undivided encoder signal on line 183, the data valid signal on line 206, the trigger signal on line 222, and the data valid pulse signal on line 456, as respectively indicated at 650, 666, 674, 129, 676, 581 and 678, and drawn to the same time scale. Again, dashed lines are utilized to more clearly indicate points which are coincident in time.

Regarding an invalid data condition, FIG. 22 makes clear that in the resultant absence of coincidence in time between high logic levels for the alignment start signal waveform 674, the undivided encoder signal waveform 129, and the data valid signal waveform 676, respectively, gate 434 of FIG. 16 will not be enabled whereby the data valid pulse signal waveform 678 will remain low and analysis results latch 436 will not be gated to transmit sample analysis data. This will, however, result as shown in the momentary driving of the trigger signal waveform 581 to a low logic level for application as described hereinabove to alignment change circuit 115 of FIG. 18 on line 222.

These invalid data rejection operational conditions of circuits 178 and 204 would, for example, be repeated three times for a three undivided encoder pulse-misalignment condition as shown and described hereinabove in conjunction with FIG. 9A.

With regard to a valid data condition, FIG. 22 makes clear that coincidence in time between high logic levels for the respective alignment start signal, undivided encoder signal and data valid signal waveforms 674, 129 and 676 is effective to enable gate 434 to transmit a negative-going data valid pulse 680 on line 456 to analysis results latch 436 to gate the latter for transmission of valid sample analysis data to the display and/or recording means 28 on line 92. Under these conditions, and since no alignment change is required, FIG. 22 also makes clear that the high logic level of data valid signal waveform 676 retains gate 474 of FIG. 17 disabled to prevent the transmission of a negative-going trigger signal pulse on lines 497 and 222 to alignment change circuit 115. This valid data operational condition of circuits 178 and 204 will, of course, occur at least once for every eight periods of the analog data signal waveform 110 of FIG. 5.

Although not specifically depicted as such in order to avoid undue complication of the drawings, it will be clear to those skilled in this art that all data and time period counts lines are 8 bit lines.

By all of the above is believed made clear that the signal generation and signal processing apparatus and methods of the invention will function in full accordance with the heretofore stated objects thereof as representatively applied to spectroscopic sample analysis to provide sample analysis results of the highest degrees of accuracy and reproducibility.

Various changes may be made in the apparatus and methods of this invention without departing from the spirit and scope thereof as defined in the appended claims.

What is claimed is:

1. In apparatus for the generation of alternating sample, dark, reference and dark light beams for a single light source attendant spectroscopic sample analysis, the improvements comprising, a fixed reference beam mirror disposed in the path of the light from said light source, a sample beam mirror disposed in the path of the light from said light source between said light source and said reference beam mirror, said sample beam mirror being generally circular and rotatable about its center and comprising four dark segments, two mirrored segments and two blank segments respectively of 45° arcuate extent and extending radially outward from the mirror center, and which segments may be seen to be arranged in the following order: mirrored, dark, blank, dark whereby, each rotation at constant speed of the sample beam mirror will result in the generation of sample, dark, reference, dark, sample, dark, reference and dark beams, respectively of equal duration in time and in that sequence; and wherein said mirrored segments are of greater radial extent than said dark segments and overlap the respective peripheries of two of said dark segments whereby the periphery of said sample beam mirror will be constituted by alternating mirrored and blank segments, respectively.

2. In apparatus as in claim 1 further comprising, signal generation means operatively associated with the periphery of said sample beam mirror and operable to generate a control signal indicative of whether a mirrored segment, or a dark or blank segment, is positioned in said light path.

3. In apparatus as in claim 2 further comprising, additional signal generation means operable attendant the rotation of said sample beam mirror to generate another control signal which may be processed to indicate the respective sequential positionings of said mirrored, dark, blank, dark, mirrored, dark, blank and data segments in said light path.

4. In sample analysis apparatus which include an integrating sphere having detecting means and a reference source, and a sample cell operatively associated with said integrating sphere, the improvements comprising, means for the generation of alternating sample, dark, reference and dark beams for direction of said sample and reference beams into said integrating sphere to spectroscopically analyze a sample in said sample cell and result in the provision by said detecting means of a multiplexed, sample analysis results analog data signal which comprises different information-bearing segments arranged serially in time, and changing at determinable signal transition points in accordance with the changes in said beams, digital control signal generation means operable attendant the operation of said beam generation means to generate a digital control signal, means to receive said analog data signal and said digital control signal, and means responsive to said analog data signal and said digital control signal for operating thereon to align said digital control signal in time with said data signal transition points whereby, the information in each of said data signal segments may be separately identified and calculated as such for calculation of the sample analysis results therefrom.

5. In apparatus as in claim 4 wherein, said beam generation means comprise, a single light source, a fixed reference beam mirror disposed in the path of the light from said light source, a sample beam mirror disposed in the path of the light from said light source between the latter and said reference beam mirror, said sample beam mirror comprising respective mirrored, dark, blank and dark sections which are sequentially positionable in said light path whereby; with said mirrored section positioned in said light path the light will be reflected therefrom to generate said sample beam, with the first-mentioned of said dark sections positioned in said light path the light will be absorbed thereby to generate a dark beam, with said blank section positioned in said light path the light will pass therethrough for reflection from said reference beam mirror to generate said reference beam, and with the second-mentioned of said dark sections positioned in said light path the light will be absorbed thereby to generate another dark beam.

6. In apparatus as in claim 4 wherein, said means for operating upon said analog data signal and said digital control signal to align said digital control signal in time with said data signal transition points comprise, means to demodulate said multiplexed analog data signal, means to demultiplex the thusly demodulated data signal, means to separately identify and calculate as such the information from the thusly demultiplexed data signal in accordance with the particular data signal segment which provided the same, means to verify the alignment of said control signal with said data signal transition points, means operable in response to said alignment verification means to change said alignment, if required, means to synchronize the operation of said demodulation, demultiplexing and alignment verification means, and means to calculate the sample analysis results from the thusly identified, calculated and alignment-verified data signal segments information.

7. In a method for sample analysis through use of an integrating sphere having detecting means and a reference source, and a sample cell operatively associated with said integrating sphere, the improvements comprising, the steps of, generating alternating sample, dark, reference and dark beams for direction of said sample and reference beams into said integrating sphere to spectroscopically analyze a sample in said sample cell and result in the provision by said detecting means of a multiplexed, sample analysis results analog data signal which comprises different information-bearing segments arranged serially in time, and changing at determinable signal transition points in accordance with the changes in said beams, generating a digital control signal attendant the generation of said beams, receiving said analog data signal and said digital control signal, and operating upon said analog data signal and said digital control signal to align said digital control signal in time with said data signal transition points whereby, the information in each of said data signal segments may be separately identified and calculated as such for calculation of the sample analysis results therefrom.

8. In a method as in claim 7 wherein, the generation of said sample, dark, reference and dark beams comprises, the steps of, disposing a reference beam mirror in the path of the light from a single light source, and sequentially positioning respective mirrored, dark, blank and dark sections of a sample beam mirror in said light path between said light source and said sample beam mirror whereby; with said mirrored section so positioned the light from said light source will be reflected therefrom to generate said sample beam, with the first-mentioned of said dark sections so positioned the light from said light source will be absorbed thereby to generate a dark beam, with said blank section so positioned the light from said light source will pass therethrough for reflection from said reference beam mirror to generate said reference beam, and with the second-mentioned of said dark sections so positioned the light from said light source will be absorbed thereby to generate another dark beam.

9. In a method as in claim 7 wherein the operation upon said analog data signal and said digital control signal comprises, the steps of, demodulating said multiplexed analog data signal, demultiplexing the thusly demodulated data signal, separately identifying and calculating as such the information from the thusly demultiplexed data signal in accordance with the particular data signal segment which provided the same, verifying the alignment of said control signal with said data signal transition points, changing that alignment, if required, in response to alignment verification, synchronizing demodulation, demultiplexing and alignment verification, and calculating the sample analysis results from the thusly identified, calculated and alignment-verified data signal segments information.

* * * * *